United States Patent

Griffiths et al.

[11] Patent Number: 6,133,550
[45] Date of Patent: Oct. 17, 2000

[54] METHOD AND APPARATUS FOR THERMAL PROCESSING OF SEMICONDUCTOR SUBSTRATES

[75] Inventors: Stewart K. Griffiths, Danville; Robert H. Nilson, Cardiss; Brad S. Mattson, Los Gatos; Stephen E. Savas, Alameda, all of Calif.

[73] Assignees: Sandia Corporation, Livermore; Mattson Technology, Inc., Fremont, both of Calif.

[21] Appl. No.: 09/140,614

[22] Filed: Aug. 26, 1998

Related U.S. Application Data

[63] Continuation-in-part of application No. 08/621,744, Mar. 22, 1996, abandoned.

[51] Int. Cl.⁷ .................................................. F27D 11/00
[52] U.S. Cl. ........................................... 219/403; 373/118
[58] Field of Search .................................. 219/385, 388, 219/390–395, 389, 402–407; 432/6; 373/109–118

[56] References Cited

U.S. PATENT DOCUMENTS

| | | | |
|---|---|---|---|
| 3,723,053 | 3/1973 | Myers et al. | 432/6 |
| 3,737,282 | 6/1973 | Hearn et al. | 432/6 |
| 4,081,313 | 3/1978 | McNeilly et al. | 156/610 |
| 4,417,347 | 11/1983 | Muka et al. | 373/158 |
| 4,468,195 | 8/1984 | Sasaki et al. | 432/36 |
| 4,481,406 | 11/1984 | Muka | 219/411 |
| 4,496,609 | 1/1985 | McNeilly et al. | 427/55 |
| 4,507,078 | 3/1985 | Tam et al. | 432/11 |
| 4,518,349 | 5/1985 | Tressler et al. | 432/11 |
| 4,540,876 | 9/1985 | McGinty | 219/405 |
| 4,555,273 | 11/1985 | Collins et al. | 148/1.5 |
| 4,649,261 | 3/1987 | Sheets | 219/390 |
| 4,698,486 | 10/1987 | Sheets | 250/492.2 |
| 4,770,630 | 9/1988 | Akimoto et al. | 432/121 |
| 4,777,022 | 10/1988 | Boldish et al. | 422/245 |
| 4,794,217 | 12/1988 | Quan et al. | 437/247 |
| 4,818,327 | 4/1989 | Davis et al. | 156/345 |
| 4,857,689 | 8/1989 | Lee | 219/10.71 |

(List continued on next page.)

FOREIGN PATENT DOCUMENTS

| | | |
|---|---|---|
| 0 134 716 A1 | 3/1985 | European Pat. Off. . |
| 62-120475 | 11/1985 | Japan . |
| 61-180438 | 8/1986 | Japan . |
| 63-260016 | 10/1988 | Japan . |
| 64-12524 | 1/1989 | Japan . |
| 2-238616 | 10/1989 | Japan . |

OTHER PUBLICATIONS

M. Murphy, "Statement of Inventorship," Mar. 3, 2000.

F. Roozeboom, Manufacturing Equipment Issues in Rapid Thermal Processing, 1993, Academic Press, Inc., ISBN 0-12-247690-5, pp. 349–423.

(List continued on next page.)

*Primary Examiner*—Tu Ba Hoang
*Attorney, Agent, or Firm*—Wilson Sonsini Goodrich & Rosati

[57] ABSTRACT

An improved apparatus and method for thermal processing of semiconductor wafers. The apparatus and method provide the temperature stability and uniformity of a conventional batch furnace as well as the processing speed and reduced time-at-temperature of a lamp-heated rapid thermal processor (RTP). Individual wafers are rapidly inserted into and withdrawn from a furnace cavity held at a nearly constant and isothermal temperature. The speeds of insertion and withdrawal are sufficiently large to limit thermal stresses and thereby reduce or prevent plastic deformation of the wafer as it enters and leaves the furnace. By processing the semiconductor wafer in a substantially isothermal cavity, the wafer temperature and spatial uniformity of the wafer temperature can be ensured by measuring and controlling only temperatures of the cavity walls. Further, peak power requirements are very small compared to lamp-heated RTPs because the cavity temperature is not cycled and the thermal mass of the cavity is relatively large. Increased speeds of insertion and/or removal may also be used with non-isothermal furnaces.

69 Claims, 16 Drawing Sheets

U.S. PATENT DOCUMENTS

| | | | |
|---|---|---|---|
| 4,891,335 | 1/1990 | McNeilly | 437/247 |
| 4,898,834 | 2/1990 | Lockwood et al. | 437/22 |
| 4,909,314 | 3/1990 | Lamont, Jr. | 165/80.3 |
| 4,914,276 | 4/1990 | Blair | 219/390 |
| 4,943,234 | 7/1990 | Söhlbrand | 432/152 |
| 5,001,327 | 3/1991 | Hirasawa et al. | 219/390 |
| 5,011,794 | 4/1991 | Grim et al. | 437/247 |
| 5,040,484 | 8/1991 | Mears et al. | 118/503 |
| 5,043,300 | 8/1991 | Nulman | 437/200 |
| 5,048,800 | 9/1991 | Miyazaki et al. | 266/256 |
| 5,059,770 | 10/1991 | Mahawili | 219/391 |
| 5,060,354 | 10/1991 | Chizinsky | 29/25.02 |
| 5,207,573 | 5/1993 | Miyagi et al. | 432/152 |
| 5,219,798 | 6/1993 | Kamakura | 437/748 |
| 5,252,807 | 10/1993 | Chizinsky | 219/390 |
| 5,343,012 | 8/1994 | Hardy et al. | 219/443 |
| 5,387,557 | 2/1995 | Takagi | 437/247 |
| 5,429,498 | 7/1995 | Okase et al. | 432/152 |
| 5,430,271 | 7/1995 | Orgami et al. | 219/388 |
| 5,445,676 | 8/1995 | Takagi | 18/719 |
| 5,520,742 | 5/1996 | Ohkase | 118/724 |
| 5,536,918 | 7/1996 | Ohkase et al. | 219/390 |
| 5,680,502 | 10/1997 | Kim | 392/416 |
| 5,695,654 | 12/1997 | Imahashi | 118/719 |
| 6,002,109 | 12/1999 | Johnsgard et al. | 219/390 |

OTHER PUBLICATIONS

R. Sheets, Automatic Cassette to Cassette Radiant Impulse Processor, Nuclear Instruments and Methods in Physics Research B6 (1985) 219–223, North–Holland, Amsterdam.

A. Shimizu et al., Reduced Thermal Budget Process Using a New Concept Single Wafer Reactor, 1st Internat'l RTP Conf. RTP'93, Sep. 1993, Scottsdale, AZ, pp. 324–328.

Proximity Heating for Rapid Thermal Processing (RTP), SEMATECH Technology Transfer 95012698–XFR.

S.K. Griffiths et al., "Analyses of Wafer Support and Transport Processes for 300 mm Wafers," $6^{th}$. International Conference on 300 mm Wafer Specification, SEMICON/Japan, Tokyo, Japan, Dec. 5, 1996.

S.K. Griffiths et al., "Thermal Gradients, Gravitational Stress and Plastic Deformation in Large Wafers," $3^{rd}$ Intern'l Workshop on 300 mm Wafer Specification, SEMICON/ WEST, San Francisco, CA, Jul. 10, 1995.

H.R. Huff et al., "Challenges and Opportunities for Dislocation–Free Wafer Fabrication and Thermal Processing: An Historical Review," $3^{rd}$ Intern'l RTP Conf, Amsterdam, Netherlands, Aug. 30, 1995.

A. Dip, "Thermal Processing of 300 mm Substrates: Thermal Process Issues," Second Large Diameter Wafer Thermal Issues Conference, Austin, TX, Sep. 25, 1996.

R.H. Nilson et al., "Scaling Batch Processes for Large Wafer Diameters," Second Large Diameter Wafer Thermal Issues Conference, SEMATECH, Austin, TX, Sep. 25, 1996.

R.H. Nilson et al., "Thermal Gradients, Gravitational Stress and Plastic Deformation in Large Wafers," Wafer Defect & Engineering Topical Conf. on Large Diameter Wafer & Thermal Stress Issues, Austin, TX, Sep. 27, 1995.

B. Leroy et al., "Warpage of Silicon Wafers,", J. Electrochem. Soc., vol. 127, No. 4, pp 961–970, Apr. 1980

R. H. Nilson et al., "Scaling wafer stresses and thermal processes to large wafers," Thin Solid Films, 315 (1998), pp 286–293.

G. Bertini et al., "Defects introduced in silicon wafers during rapid isothermal annealing: Thermoelastic and thermoplastic effects," J. Appl. Phys., 56 (10), pp. 2922–2929, Nov. 1984.

M. Suezawa et al., "Dislocation Dynamics in the Plastic Deformation of Silicon Crystals," Phys. Stat. Sol., 51, 217, 1979.

B. DeHart et al., "New developments in rapid thermal processing," Solid State Tech., Feb. 1996, pp 107–110.

K.G. Reid et al., "Rapid thermal processing for ULSI applications: An overview," Solid State Tech., Feb. 1996, pp 63–74.

R.T. Fulks et al., "Rapid isothermal annealing of ion implantation damage using a thermal radiation source," Appl. Phys. Lett. 39(8), Oct. 15, 1981, pp. 604–606.

D. Aitken et al., A New VLSI Compatible Rapid Thermal Processing System, Elsevier Science Publishers B.V., 0168–583X/87.

METHOD AND APPARATUS FOR THERMAL PROCESSING OF SEMICONDUCTOR SUBSTRATES

RELATED APPLICATION

This application is a continuation-in-part of, and claims priority from, U.S. patent application Ser. No. 08/621,744 titled "Method and Apparatus for Rapid Thermal Processing of Semiconductor Wafers" filed on Mar. 22, 1996 now abandoned by Stewart K. Griffiths and Robert H. Nilson and assigned to Sandia Corporation.

STATEMENT OF GOVERNMENT INTEREST

This invention was made with Government support under contract No. DE-AC04-94AL85000 awarded by the U.S. Department of Energy to Sandia Corporation. The Government has certain rights in the invention.

BACKGROUND OF THE INVENTION

1. Field of the Invention

The field of the present invention relates in general to semiconductor processing. More particularly, the field of the invention relates to a method and apparatus for rapid thermal processing of semiconductor substrates, such as silicon wafers.

2. Background

High temperature processing of silicon wafers is important for manufacturing modern microelectronics devices. Such processes, including silicide formation, implant anneals, oxidation, diffusion drive-in and chemical vapor deposition (CVD), may be performed at temperatures ranging from about 400° C. to 1200° C. in either multi-wafer batch furnaces or in single-wafer rapid thermal processors. However, both of these methods of wafer processing may suffer from several serious shortcomings.

A traditional batch furnace typically heats a horizontal or vertical stack of from 25 to 300 wafers by radiation from the hot walls of a cylindrical cavity. The cavity walls may be heated by electrical elements that can be axially segmented, wherein each segment is individually controlled to help maintain prescribed wafer temperatures along the entire furnace length, thereby minimizing axial variations in processing conditions. However, problems may be encountered with these furnaces for some processes, such as inability to limit time-at-temperature, inconsistent wafer-to-wafer temperature uniformity, and radial temperature variations when heating or cooling a stack of wafers. Radial gradients may arise due to preferential heating or cooling of wafer edges by radiative exchange with the furnace walls, such that the edge temperature leads or lags the center temperature during thermal transients.

Radial temperature variations in batch furnaces can lead to two serious problems: lack of uniformity in thermally activated processes; and thermal stresses which, if excessive, will result in plastic deformations commonly referred to as bow, warpage or slip. These problems can be reduced or avoided by limiting both temperature ramp rates and the speeds at which wafers are pushed into or pulled from the furnace. Inter-wafer spacing can also be increased to permit higher ramp rates and higher push and pull speeds for the same radial temperature variations. With either of these approaches, however, radial temperature uniformity is obtained at the expense of decreased furnace throughput and/or increased process time.

Many modern microelectronics circuits require feature sizes smaller than 1 $\mu$m and junction depths less than a few hundred angstroms. In order to limit both the lateral and downward diffusion of dopants, it is desirable to reduce the duration of high temperature processing. One approach for reducing processing time uses a small-batch fast-ramp furnace which achieves faster processing by increasing the wafer spacing and, hence, by reducing both the batch size and the throughput of an otherwise conventional batch furnace. Another approach uses a single-wafer rapid thermal processor ("RTP").

A typical single wafer RTP uses high intensity lamps, optical temperature sensors and sophisticated control algorithms to heat a single semiconductor wafer at a very high temperature ramp rate, thereby reducing the problem of unwanted dopant diffusion. The wafer is generally heated to temperatures of approximately 450° C. to 1400° C. and may be rapidly cooled after processing. Because an entire surface of the semiconductor wafer can be exposed to the heating source and to any CVD reactant gases, problems associated with radial energy and chemical species transport inherent in batch furnace processing may be reduced or eliminated. Further, process times may be reduced, while maintaining wafer throughput comparable to that of a batch furnace. This reduced process time reduces the time-at-temperature, permitting smaller feature sizes.

Nonetheless, problems may be encountered with the use of high intensity lamps as a heat source, particularly for larger diameter wafers. In particular, it may be difficult to maintain a uniform temperature across a wafer. Not only do temperature differences arise during heating and cooling transients, as in traditional batch furnaces, but non-uniformities may also persist during processing. The interior walls of typical lamp based RTP systems are usually relatively cool and are not heated to a uniform equilibrium process temperature as in a conventional batch furnace. Different radial locations on the wafer surface receive different fractions of their incident radiation from each of the lamps and have different views of the relatively cool side walls. As a result, it may be extremely difficult to ensure that the net radiant heat flux, and hence the equilibrium temperature, will be the same at all points on the wafer. To this end, lamp based systems typically use some combination of optical guides, lenses, and/or reflectors to more evenly distribute radiant energy onto the wafer. In spite of these measures, it may be necessary in some systems to actively cycle individual lamps or groups of lamps on and off at different intervals to compensate for unintended non-uniformities of the radiant energy distribution. These non-uniformities may be difficult to predict. It may be necessary to dynamically detect temperature non-uniformities and actively adjust heating during processing. This, in turn, may require complex temperature measurement systems using radiation from the wafer, but this has dependencies on wafer emissivity. These difficulties are generally avoided in typical batch furnaces because the wafers are placed in a substantially isothermal enclosure and eventually reach temperature equilibrium with the enclosure, regardless of the wafers' optical properties. Additional problems may be encountered in some lamp based systems due to aging and degradation of lamps and other components. As a result, it may be difficult to maintain repeatable performance and frequent replacement of parts may be necessary.

Non-lamp RTP systems have been developed which are intended to overcome some of the problems encountered with conventional lamp based systems. In one system, a vertical semiconductor wafer processing furnace is axially divided into two zones which are maintained at differing, but steady, temperatures by separately controlled resistance heaters. The wafer temperature and ramp rates during heating and cooling are controlled by translating the wafer along the furnace axis, thereby changing the geometric view factors which determine the relative amounts of radiation received by the wafer from the hotter and colder zones. Other systems use a heated plate for heating the wafer. The wafer may be moved away from the plate on pins prior to removal from the furnace. At least one system has been proposed where the wafer is moved adjacent to a heat sink for cooling prior to removal from the furnace. Typically, non-lamp RTP systems move the wafer through a transitional heat zone and/or actively cool the wafer before removal. Since these furnaces generally are not isothermal, it is difficult to guarantee uniform wafer temperature unless the wafer is positioned well within an isothermal zone. In addition, requiring a separate cooling step may decrease throughput, increase the reactor size and/or increase heat losses and power consumption. On the other hand, if a wafer is inserted and removed in a conventional manner from a heated furnace cavity at very high temperatures without a transitional heat zone or cooling, plastic deformation may result (particularly if the wafer is repetitively exposed to such stresses over multiple process steps). 300 mm and larger diameter wafers are particularly susceptible to such plastic deformation.

What is desired is a semiconductor processing system and method that can accommodate large semiconductor substrates while maintaining a highly reproducible and uniform substrate processing temperature.

What is also desired is a system and method for processing semiconductor substrates at high temperatures with reduced potential for plastic deformation. Preferably, such a system and method would allow for a substrate to be removed from a heated furnace at high temperatures while maintaining a high throughput.

SUMMARY OF THE INVENTION

One aspect of the present invention provides an improved system and method for thermal processing of a semiconductor substrate with reduced potential for plastic deformation. In one embodiment, a semiconductor substrate is inserted into a heated cavity for thermal processing. After processing, the semiconductor substrate is rapidly withdrawn from the heated cavity. High speeds of insertion and withdrawal are used to reduce temperature differences across the substrate as it enters and is removed from the heated processing environment, thereby reducing or eliminating one cause of plastic deformation which might otherwise occur. For instance, in an exemplary embodiment, the substrate withdrawal speed may range from about 0.3 to 2.5 or more meters per second, or any range subsumed therein. The desired speed may be selected based on, among other things, substrate temperature, substrate diameter and thickness, cost and complexity of required robotics, and tolerable level and length of defects. For instance, higher speeds may be selected for substantially defect-free processing of larger substrates (e.g., 300 mm or larger) at high temperatures (e.g., in excess of 1000° C.). It is an advantage of these and other aspects of the present invention that semiconductor substrates may be thermally processed at high temperatures with high throughput.

Another aspect of the present invention provides for intermediate insertion and withdrawal speeds to be used for applications where short, point-like defects at the edge of the substrate may be acceptable. It is an advantage of this and other aspects of the present invention that unacceptably large defects may be avoided without requiring unduly high speeds of insertion and withdrawal. A simpler wafer transport system may be used than in some high speed embodiments for larger wafers, because the wafers may be held in place by friction rather than requiring a more complex holder.

Another aspect of the present invention provides for high speed withdrawal to be used in combination with a transitional heat zone or cooling zone for removing a substrate from a heated cavity. By using higher than normal withdrawal speeds, the size of transitional heat zones and/or the degree of cooling may be reduced relative to that which would otherwise be required to reduce or avoid plastic deformation.

Another aspect of the present invention provides for an improved furnace for thermal processing of semiconductor substrates. One exemplary embodiment provides both temperature stability and temperature uniformity similar to that of a conventional batch furnace, as well as processing speeds and reduced time-at-temperature similar to that of a rapid thermal processor (which may be necessary to produce the small feature sizes required by many modem microelectronics circuit designs). In such an embodiment, a semiconductor substrate is rapidly inserted into and withdrawn from a heated cavity maintained at a relatively constant and substantially uniform temperature. Rapid insertion of the wafer and its rapid withdrawal at the conclusion of processing serves to minimize the temperature differences between the leading and trailing edges of the substrate as it enters and leaves the furnace, thereby minimizing thermal stress and reducing or preventing the occurrence of plastic deformation (i.e., bow, warpage and slip). This aspect of the present invention reduces or prevents stress damage while also reducing the overall time-at-temperature. This is in contrast to conventional batch furnaces where a low speed of insertion and withdrawal is used to avoid excessive radial temperature differences. In addition, in contrast to single wafer RTP systems which use cold walls or temperature zones, embodiments of the present invention which use a substantially isothermal furnace provide relatively simple temperature control with a high level of uniformity.

Additional aspects of the present invention provide for substrate carriers which reduce heat losses from the perimeter of a semiconductor substrate after heating and allow the substrate to be rapidly removed from a furnace at elevated temperatures. In addition to thermal stress resulting from the temperature difference between the leading and trailing edges during insertion and withdrawal of a semiconductor substrate from a heated cavity, preferential heating or cooling at the perimeter of a semiconductor substrate can also be a significant source of thermal stress. In exemplary embodiments of the present invention, a substrate carrier, slip ring or other thermal shield may be used to protect the perimeter of the substrate from excess radiative heat transfer. Such thermal shielding may be provided as a part of a substrate carrier for high speed insertion and withdrawal. It is an advantage of these and other aspects of the present invention that thermal stress from both preferential heating or cooling at the perimeter of a semiconductor substrate and from inserting and withdrawing a semiconductor substrate from a heated cavity may be controlled to reduce or eliminate plastic deformation.

DESCRIPTION

Figure 1:
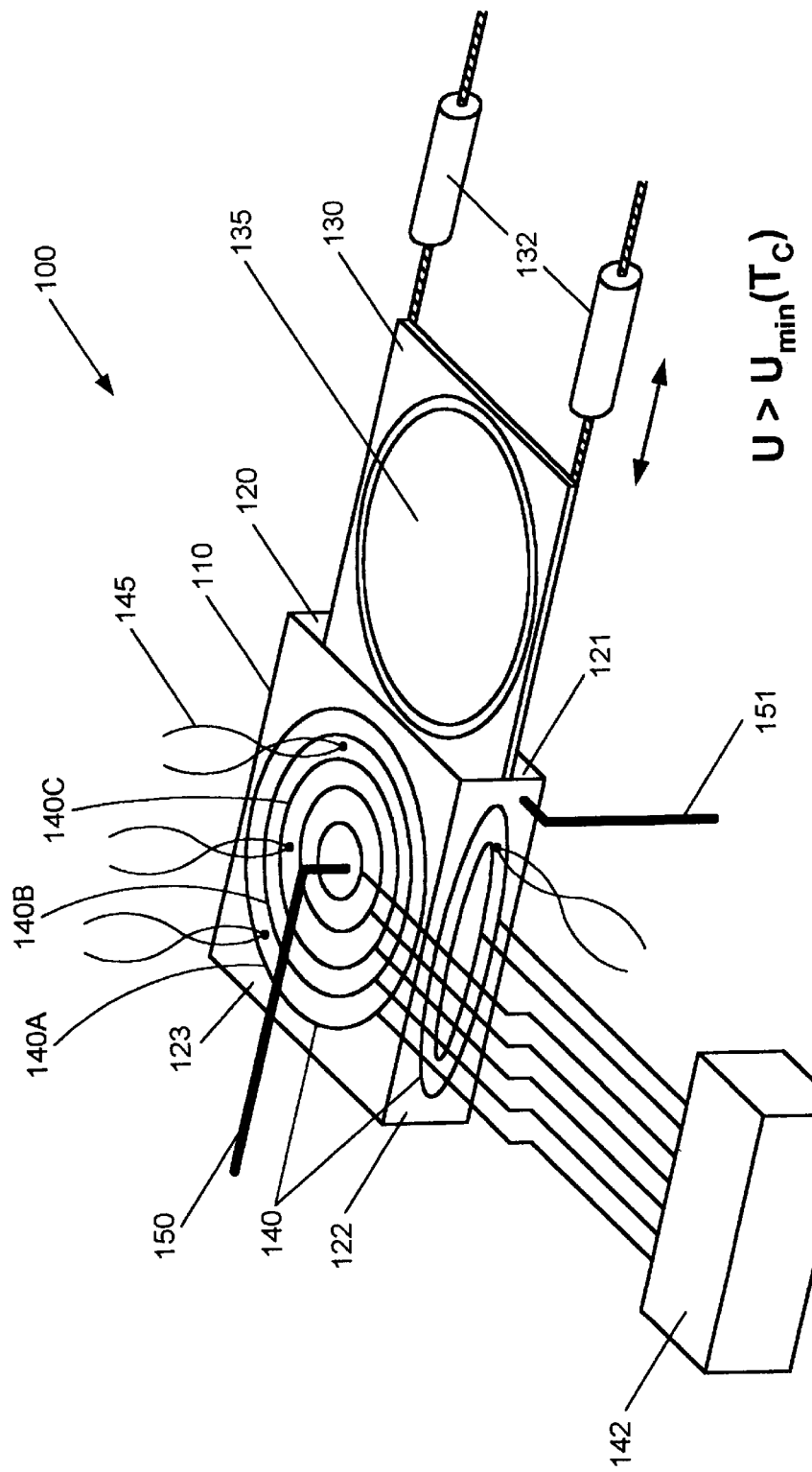
FIG. 1 illustrates a first exemplary embodiment of the present invention.

Aspects of the present invention provide a method and apparatus for rapid thermal processing of semiconductor substrates. In a first exemplary embodiment, a semiconductor substrate, such as a silicon wafer, is rapidly inserted and rapidly withdrawn from a heated cavity. The heated cavity may be a substantially isothermal cavity maintained at a substantially constant processing temperature. In other embodiments, the heated cavity may be formed from a heated plate enclosed within insulating walls. The substrate may be moved toward the heated plate for processing and moved away from the heated plate prior to withdrawal. Additional thermal processor configurations, including those with transitional temperature zones and cooling mechanisms, might also be used in other embodiments. When the substrate is removed from the heated cavity, it is exposed to a temperature differential which results in thermal stress and which may lead to plastic deformation, particularly for larger substrates (such as, for example, 300 mm and larger silicon wafers). In accordance with the first embodiment of the present invention, however, the speeds of insertion and of withdrawal of the semiconductor substrate are sufficiently large to substantially reduce or prevent plastic deformation of the substrate. As a result, the first embodiment is capable of providing rapid heating and rapid cooling of a single wafer (or in alternate embodiments two wafers) at a time, while substantially reducing or eliminating problems such as plastic deformation of the wafers, excessive time-at-temperature resulting in excessive dopant diffusion, wafer-to-wafer temperature non-uniformity, and cross-wafer temperature non-uniformity.

The apparatus and method according to the first embodiment utilize a process chamber comprising a furnace, wherein the base, side walls and top of the furnace define a cavity, the cavity having a width and a depth large enough to contain a semiconductor wafer and a holder or support for the wafer. The temperature of the cavity may be controlled by a microprocessor-based system employing a PID controller attached to the heaters and using measurements of wall temperatures as inputs. The temperature of the cavity in the first embodiment is raised by heaters, such as resistance heaters, attached to or adjacent to the furnace walls. The heaters can be segmented to provide a substantially uniform and constant temperature distribution throughout the cavity and over the surfaces of the semiconductor wafer. The apparatus and method of the first embodiment further provide a robot or other mechanism for rapidly inserting and withdrawing the semiconductor wafer, wherein the rates of both insertion and withdrawal are rapid enough to substantially reduce or prevent plastic deformation of the wafer due to thermal gradients.

It is known that if a significant temperature difference exists across a silicon wafer, plastic deformation of the wafer will occur. Thus if a semiconductor wafer is inserted or withdrawn slowly from a high temperature cavity (e.g., above 900° C.), the temperatures at its leading and trailing edges can differ significantly due to rapid cooling by radiation of the portion of the wafer outside of the cavity. This can lead to plastic deformation of the wafer. However, it has been discovered that if the semiconductor wafer is inserted and withdrawn at high speeds, plastic deformation can be substantially reduced or eliminated even for high temperature processing (e.g., above 1000° C.). For instance, if a 300 mm silicon wafer is removed at a rate of 0.15 meters per second from a furnace at 1100° C., plastic deformation will typically result. However, as the wafer speed is increased, the number and severity of defects will decrease. At or near a desired threshold speed, defects due to the insertion/withdrawal temperature differentials are substantially prevented. It is understood that defects may still result from preferential heating or cooling at the edge of a semiconductor substrate. However, as described below, a wafer carrier, slip ring or other thermal shield may be used to reduce thermal edge stress.

It has been further discovered that the threshold speed of withdrawal of the semiconductor wafer from the cavity is greater than the threshold speed of insertion into the cavity at the same temperature under comparable conditions. This is so because the yield strength of semiconductor wafers, in particular silicon, falls with increasing temperature. Thus, a temperature difference between the leading and trailing edges of a semiconductor wafer will more likely cause plastic deformation if it occurs just after withdrawal when the wafer is still hot and, hence, much weaker than just after insertion.

In order to prevent plastic deformation of a semiconductor wafer during heating and cooling in the first embodiment, it is desirable that the entire surface of the wafer be exposed almost simultaneously to the same thermal environment. This can be accomplished by the furnace design of the first embodiment, described herein, that provides for heating a semiconductor wafer supported on a carrier by rapidly inserting the wafer and carrier into a heated cavity and rapidly withdrawing the semiconductor wafer and carrier at the conclusion of processing.

The cavity, defined by the interior furnace walls, is held at a substantially constant processing temperature in the first embodiment. Rapid insertion and rapid withdrawal of the wafer and carrier serve to reduce the temperature differences between the leading and trailing edges of the wafer as it enters and leaves the furnace, thereby reducing thermal stress and substantially preventing the occurrence of bow, warpage and slip due to such temperature differences. Thus, the first embodiment substantially prevents stress damage while reducing the overall time-at-temperature. This is in contrast to conventional batch furnaces where a low speed of insertion and withdrawal is used to avoid excessive radial temperature differences (which also increases the time-at-temperature during which thermal processing occurs).

In the first embodiment, by maintaining the cavity receiving the wafer at a substantially isothermal temperature, for example by means of resistance heaters near or attached to the furnace walls, temperature measurement can be simplified relative to conventional cold wall, lamp based RTP systems. Since the cavity receiving the semiconductor wafer is maintained in a substantially isothermal condition, the temperature of the furnace cavity walls (which may be measured using thermocouples imbedded in the furnace walls) may be used to closely approximate the wafer temperature at equilibrium. By using a plurality of thermocouples and a plurality of segmented resistance heaters in the first embodiment, the temperature of the cavity as well as the temperature of the wafer can be controlled to achieve a desired processing temperature and level of uniformity.

The furnace of the first embodiment further provides against large transient excursions in the cavity temperature, thereby permitting the use of simple control algorithms for controlling the furnace cavity temperature (and, in turn, the wafer temperature). It will also be appreciated that because the cavity of the furnace is maintained at a substantially constant temperature in the first embodiment, and because of the large thermal mass of the furnace relative to the semiconductor wafer and the associated wafer carrier, the peak power requirements are significantly reduced over conventional RTP systems that are heated up and cooled down for each wafer.

FIG. 1 illustrates a rapid insertion rapid thermal processor (RIRTP), generally indicated at 100, according to the first exemplary embodiment of the present invention. Referring to FIG. 1, the RIRTP comprises a furnace 110 having a cavity 120 maintained at a substantially constant and isothermal processing temperature. Isothermal cavity 120 is defined by the base 121, side walls 122 and top 123 of furnace 110 and is adapted to receive a semiconductor wafer carrier 130 supporting a semiconductor wafer 135. The base 121, side walls 122 and top 123 of furnace 110 may each be provided with heaters 140 (not all shown), such as resistance heaters, to heat isothermal cavity 120 to a substantially constant processing temperature. Heaters 140 can be segmented as shown by segments 140A, 140B, and 140C, and the segments may be individually controlled by controller 142 to provide greater control over the temperature of cavity 120 and to provide uniform temperature over the surface of semiconductor wafer 135 after semiconductor wafer carrier 130 and semiconductor wafer 135 have been inserted into cavity 120. The base 121, side walls 122 and top 123 of furnace 110 are further provided with a plurality of thermocouples 145 (not all shown), useful for measuring and controlling the temperature of isothermal cavity 120 and for ensuring that temperatures of semiconductor wafer 135, resident in cavity 120, are substantially uniform. In order to withstand the high temperatures sometimes encountered during wafer processing (>1000° C.), the base 121, side walls 122 and top 123 of furnace 110 can be made of various high temperature materials, such as but not limited to, metals, ceramics, glasses or refractory compounds. Gas supply 150 and gas exhaust 151 may be provided for exposing the wafer to reactant gases useful for chemical vapor deposition.

Figure 2A:
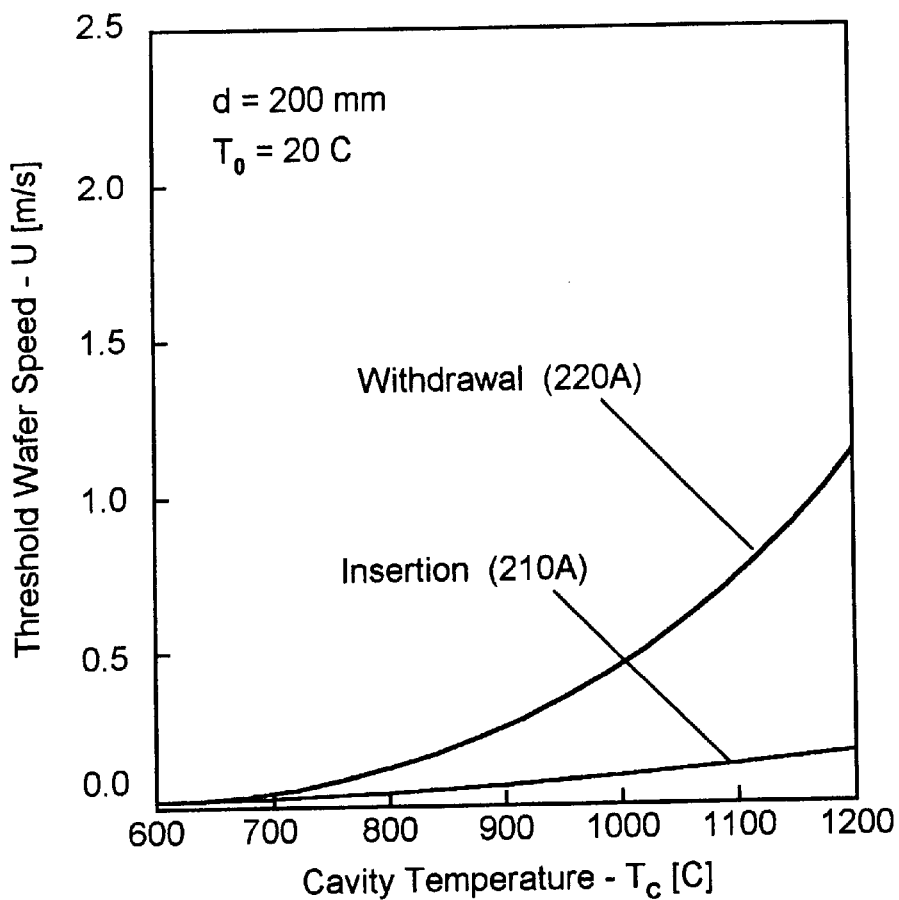
FIG. 2A is a graph depicting approximate desired threshold speeds for insertion and withdrawal of a relatively high strength silicon wafer for the first embodiment in order to substantially prevent plastic deformation of the silicon wafer.

FIG. 2A is a graph which shows calculated threshold speeds for the first embodiment which are expected to substantially prevent plastic deformation of a relatively high strength 200 mm silicon wafer in the first embodiment during insertion of the wafer into cavity 120 and its subsequent withdrawal. In particular, FIG. 2A shows two curves which relate the desired threshold speed of withdrawal 220A and the desired threshold speed of insertion 210A of a semiconductor wafer as a function of cavity temperature in the first embodiment. These curves represent approximate plastic deformation boundaries, i.e., at insertion or withdrawal speeds above the boundaries defined by these curves, the semiconductor wafer is not expected to experience plastic deformation due to the thermal differentials of insertion and withdrawal. Thus, for cavity temperatures from about 1100° C. to 1200° C., the typical peak operating range for a rapid thermal processor, the threshold insertion speed increases from about 0.13 to about 0.18 m/s and the threshold withdrawal speed increases from about 0.72 to about 1.16 m/s. As the insertion and withdrawal speeds are increased, the time during which the wafer is exposed to the thermal differential between the environment inside the heated cavity and outside the cavity is reduced. Table 1 below summarizes the threshold speeds of insertion and withdrawal for a relatively high strength silicon wafer at various temperatures and shows the corresponding time during which the wafer is exposed to the thermal differential.

TABLE 1

| Temp [° C.] | Insertion | | Withdrawal | |
| --- | --- | --- | --- | --- |
| | Speed [m/s] | Time [s] | Speed [m/s] | Time [s] |
| 600 | 0.01 | 20.00 | 0.02 | 10.00 |
| 700 | 0.02 | 10.00 | 0.05 | 4.00 |

TABLE 1-continued

| | Insertion | | Withdrawal | |
|---|---|---|---|---|
| Temp [° C.] | Speed [m/s] | Time [s] | Speed [m/s] | Time [s] |
| 800 | 0.04 | 5.00 | 0.12 | 1.67 |
| 900 | 0.06 | 3.33 | 0.24 | 0.83 |
| 1000 | 0.09 | 2.22 | 0.43 | 0.46 |
| 1100 | 0.13 | 1.54 | 0.72 | 0.28 |
| 1200 | 0.18 | 1.11 | 1.16 | 0.17 |

Figure 2B:
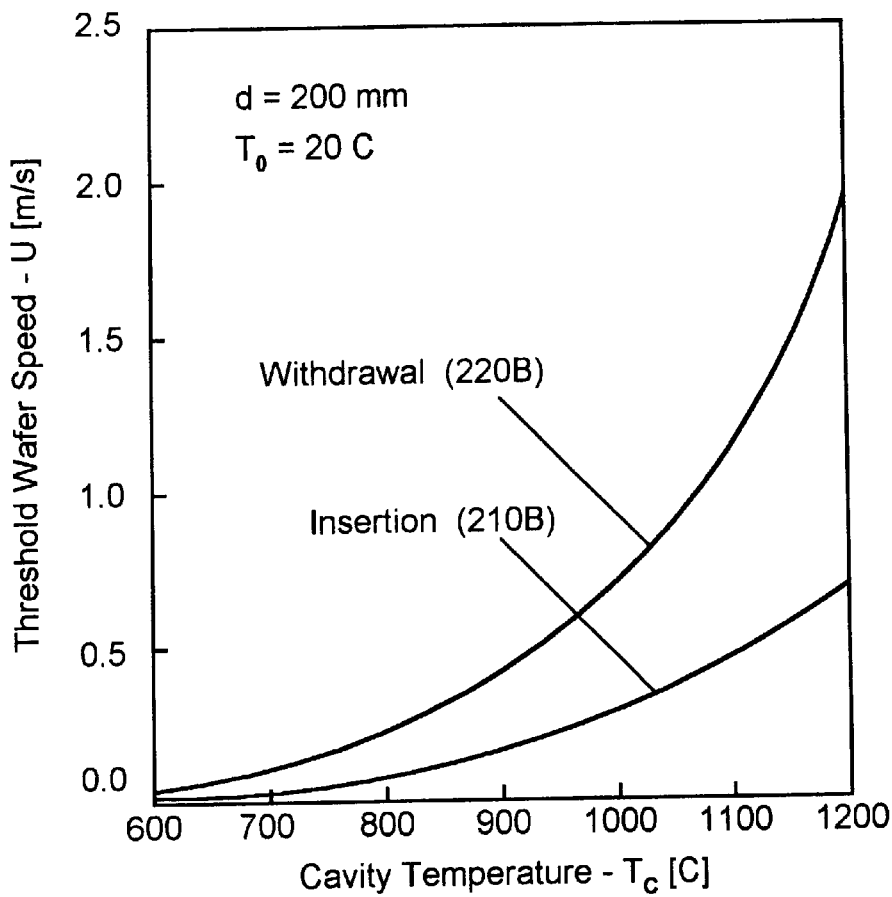
FIG. 2B is a graph depicting approximate desired threshold speeds for insertion and withdrawal of a relatively low strength silicon wafer for the first embodiment in order to substantially prevent plastic deformation of the silicon wafer.

FIG. 2B is a graph which shows calculated threshold speeds for the first embodiment which are expected to substantially prevent plastic deformation of a relatively low strength 200 mm silicon wafer in the first embodiment during insertion of the wafer into cavity 120 and its subsequent withdrawal. In particular, FIG. 2B shows two curves which relate the desired threshold speed of withdrawal 220B and the desired threshold speed of insertion 210B of a semiconductor wafer as a function of cavity temperature in the first embodiment. Table 2 below summarizes the threshold speeds of insertion and withdrawal for a relatively low strength silicon wafer at various temperatures and shows the corresponding time during which the wafer is exposed to the thermal differential.

TABLE 2

| | Insertion | | Withdrawal | |
|---|---|---|---|---|
| Temp [° C.] | Speed [m/s] | Time [s] | Speed [m/s] | Time [s] |
| 600 | 0.02 | 10.00 | 0.04 | 5.00 |
| 700 | 0.04 | 5.00 | 0.10 | 2.00 |
| 800 | 0.08 | 2.50 | 0.21 | 0.95 |
| 900 | 0.14 | 1.43 | 0.42 | 0.48 |
| 1000 | 0.25 | 0.80 | 0.75 | 0.27 |
| 1100 | 0.42 | 0.48 | 1.26 | 0.16 |
| 1200 | 0.69 | 0.29 | 1.99 | 0.10 |

In each of the above cases, the threshold withdrawal speed is larger than the threshold insertion speed because the yield strength of semiconductor wafers, in particular silicon, falls with increasing temperature. Thus, establishing a significant temperature difference between the leading and trailing edges is more likely to cause plastic deformation during withdrawal, when the wafer temperature is high, than during insertion, when the wafer temperature is low.

Figure 4:
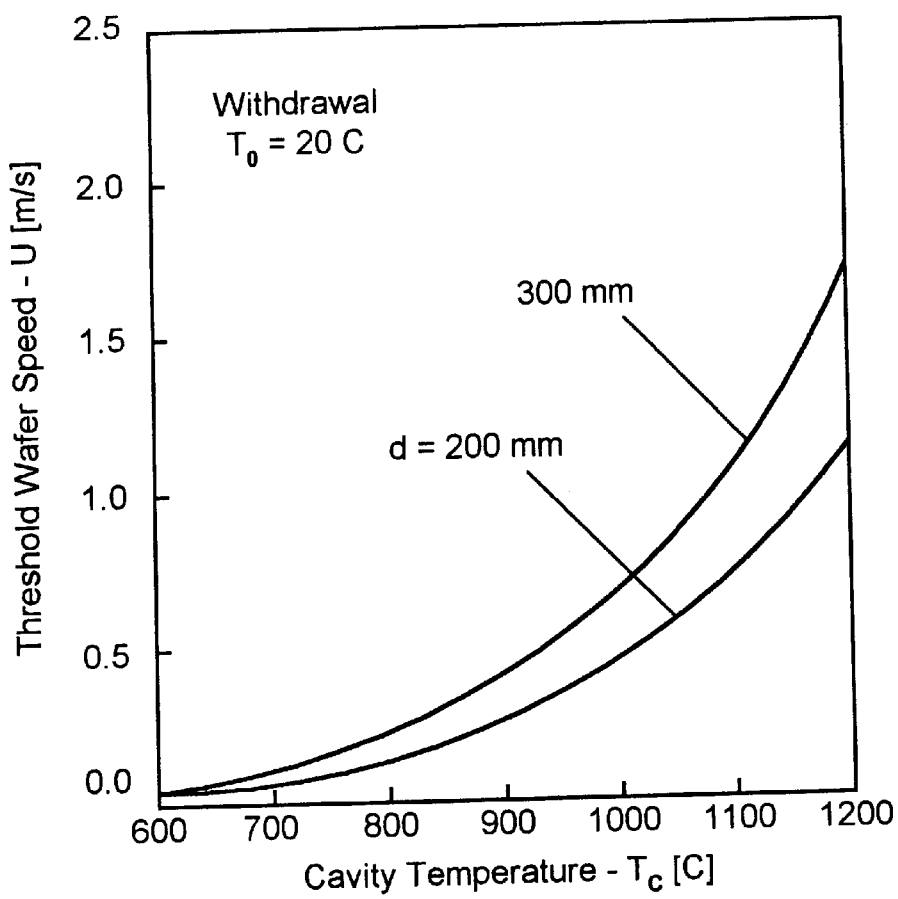
FIG. 4 is a graph comparing desired threshold speeds of withdrawal for 200 mm and 300 mm silicon wafers in order to substantially prevent plastic deformation in a furnace according to the first embodiment.

In addition to a strong dependence of the desired wafer speeds of insertion and withdrawal on the cavity or wafer temperature, the desired speed also depends on the wafer diameter (which may be, for instance, 150 mm, 200 mm, 300 mm or 400 mm or more). As the wafer size increases, the time available for differential heating/cooling of the leading and trailing portions of the wafer increases if the speeds are held fixed. This leads to an increased magnitude of the temperature difference between the leading and trailing edges of the wafer and a corresponding increase in the maximum thermal stress. Thus to maintain a comparable stress in a larger wafer, the speeds of insertion and withdrawal should be increased with increasing wafer size to maintain a substantially defect-free condition (or in applications where some defects are tolerated, to maintain defects below some desired size and/or number limit). FIG. 4 is a graph comparing desired threshold speeds of withdrawal for 200 mm and 300 mm silicon wafers in order to substantially prevent plastic deformation in the first embodiment of the present invention. Table 3 below summarizes the threshold speeds of withdrawal for these wafer at various temperatures and shows the corresponding time during which the wafer is exposed to the thermal differential.

TABLE 3

| | 200 mm | | 300 mm | |
|---|---|---|---|---|
| Temp [° C.] | Speed [m/s] | Time [s] | Speed [m/s] | Time [s] |
| 600 | 0.02 | 10.00 | 0.03 | 10.00 |
| 700 | 0.05 | 4.00 | 0.08 | 4.00 |
| 800 | 0.12 | 1.67 | 0.18 | 1.67 |
| 900 | 0.24 | 0.83 | 0.36 | 0.83 |
| 1000 | 0.43 | 0.46 | 0.65 | 0.46 |
| 1100 | 0.72 | 0.28 | 1.09 | 0.28 |
| 1200 | 1.16 | 0.17 | 1.74 | 0.17 |

In both cases, the wafer is assumed to be well supported such that gravitational stresses (discussed further below) are small and the wafer edge is assumed to be shielded from excess radiative cooling such that edge stresses are likewise small. Under these conditions, FIG. 4 illustrates that the desired threshold speed increases about linearly with wafer diameter.

For even larger wafers, or for cases in which the wafer support is such that gravitational stresses are not negligible, the desired speeds will increase more rapidly than in proportion to the size. This is because gravitational stresses scale as the square of the wafer diameter as discussed further below. Thus wafer speeds should be increased more rapidly than the increase in diameter in order for combined thermal and gravitational stresses to remain constant. It is believed that edge stresses, on the other hand, have no dependence on wafer size and little dependence on wafer speed, so edge stresses should not substantially affect desired wafer speeds as wafer size increases.

The rapid insertion rapid thermal processor (RIRTP) 100 further includes a robot 550 or other mechanism (as shown at 132 in FIG.1) attached to wafer carrier 130 for inserting semiconductor wafer carrier 130 and semiconductor wafer 135, supported thereon, into cavity 120 and for subsequently withdrawing semiconductor wafer carrier 130 and semiconductor wafer supported thereon. In the first embodiment, the robot or other mechanism may be configured to operate at speeds sufficiently large to substantially prevent plastic deformation of wafer 135, as set forth in FIGS. 2 and 4.

Insertion and withdrawal mechanisms suitable for transport of a semiconductor wafer into a cavity at high speeds in the first embodiment may include but are not limited to, pneumatic drives, high speed ball-screw drives, belt drives, rodless actuators and linear servo and stepper motors. Such mechanisms are typically capable of repetitively positioning the semiconductor wafer carrier within the cavity to tolerances closer than 1 mm.

Figure 3:
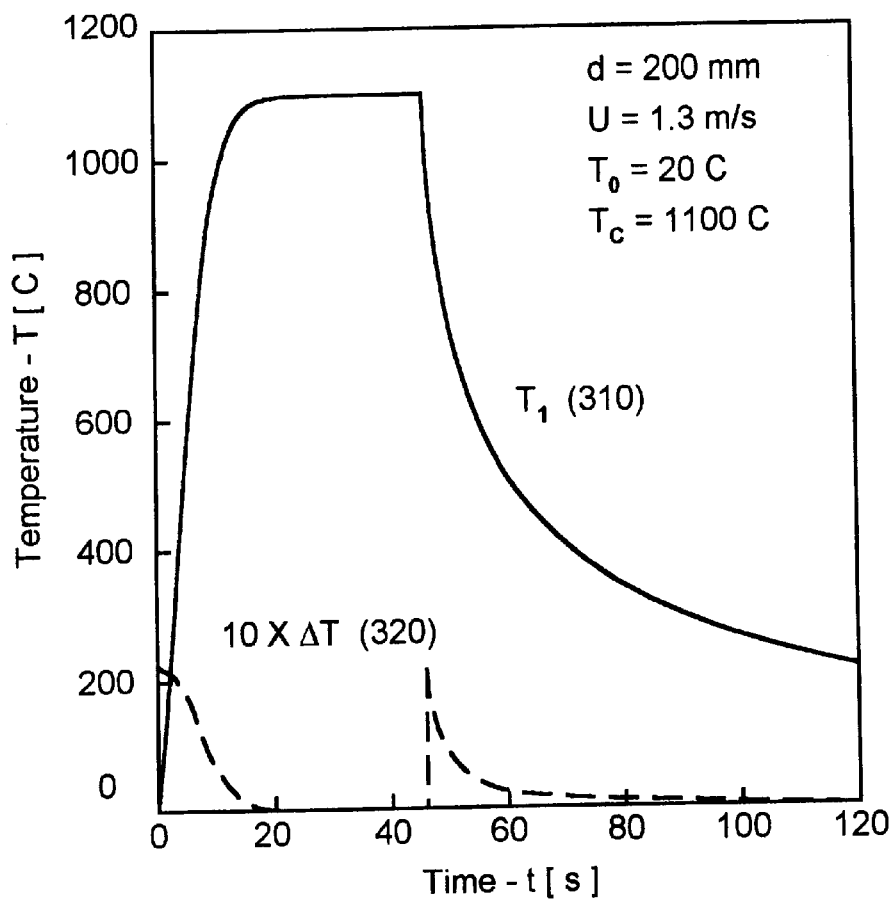
FIG. 3 depicts the computed temperatures and temperature differences of a semiconductor wafer during a typical processing cycle for the first embodiment of the present invention.

If, as shown in FIG. 3, insertion and withdrawal of a semiconductor wafer takes place at speeds greater than the desired threshold (e.g., as prescribed by the curves shown in FIGS. 2A and 2B) for the first embodiment, then the temperature difference between the leading and trailing edges of the wafer will be sufficiently small that plastic deformation of the wafer is expected to be substantially prevented. Curve 310 shows the temperature history of a semiconductor wafer 135, having an initial temperature of about 20° C., which has been inserted at a speed of about 1.3 m/s into an isothermal cavity 120 and held at a constant temperature of about 1100° C. Within less than 20 seconds, semiconductor wafer 135 has achieved a nearly uniform and constant temperature of 1100° C. (cf. curve 310). Curve 320 shows that the maximum temperature difference between the leading and trailing edges of semiconductor wafer 135 is about 22° C. After about 45 seconds, semiconductor wafer 135 is withdrawn from isothermal cavity 120. Curve 320 shows that the maximum temperature difference between leading and trailing edges of semiconductor wafer 135 is again about 22° C.

In the first embodiment, typical times-to-temperature range from 30 to 16 seconds for cavity temperatures of 1000° C. to 1200° C. and an initial semiconductor wafer temperature of 20° C., corresponding to temperature ramp rates of from about 30° C. to 75° C./s. Cool-down rates for semiconductor wafers processed by the first embodiment can be much greater than for wafers processed by typical conventional RTPs. In the first embodiment, the wafer may be withdrawn at the processing temperature into the ambient and thus radiates strongly to the ambient, thereby minimizing time-at-temperature. Thus, total in-cavity times are small for the first embodiment since no wafer cooling is required before the wafer is withdrawn from the furnace cavity. Of course, in some embodiments transitional heat zones or cooling may be used in combination with elevated withdrawal speeds.

The RIRTP of the first embodiment is believed to be capable of performing a 0.25 micron boron drive-in with a total in-cavity time of only 65 seconds at a cavity temperature of 1100° C. At cavity temperatures of 1050° C. and 1150° C., total in-cavity times for this process are 160 and 30 seconds, respectively. Further, the drive-in uniformity between the leading and trailing edges of the semiconductor wafer is expected to be better than 1% at all three cavity temperatures in the first embodiment.

Figure 5:
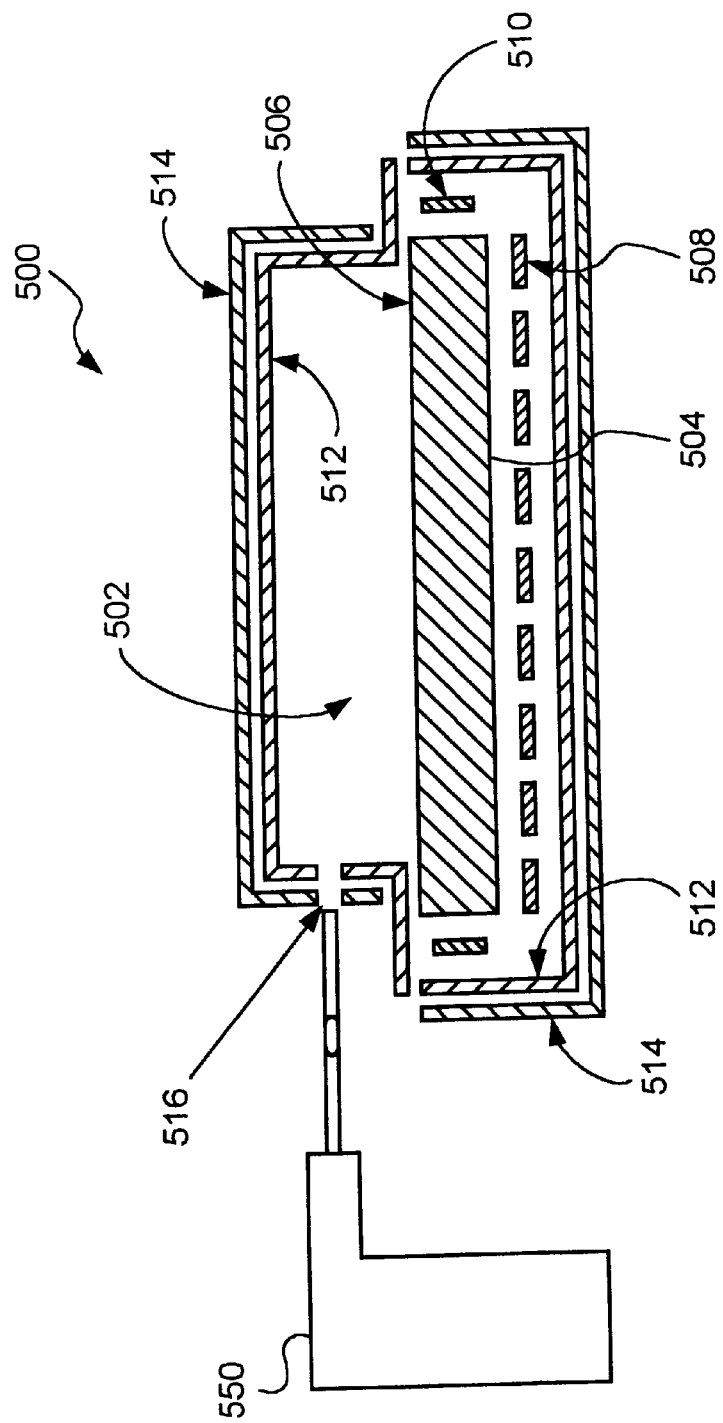
FIG. 5 is a side cross section of a thermal processor which may be used in a second embodiment of the present invention.

FIG. 5 is a side cross section of a thermal processor, generally indicated at 500, which may be used in a second exemplary embodiment of the present invention. The operation of a similar thermal processor which may be used in connection with alternate embodiments of the present invention is described in U.S. patent application Ser. No. 08/499,986, titled "System and Method for Thermal Processing of a Semiconductor Substrate," filed Jul. 10, 1995, by Kristian E. Johnsgard, Brad S. Mattson, James McDiarmid and Vladimir J. Zeitlin, the entire disclosure of which is hereby incorporated herein by reference (the "'986 Application"). Additional thermal processor configurations and features that may be used in connection with rapid insertion and/or withdrawal of semiconductor substrates according to exemplary embodiments of the present invention are described in U.S. patent application Ser. No. 08/876,788, titled "System and Method for Thermal Processing of a Semiconductor Substrate," filed Jun. 16, 1997, by Kristian E. Johnsgard, Brad S. Mattson, James McDiarmid and Vladimir J. Zeitlin (the "'788 Application"), U.S. patent application Ser. No. 08/923,661, titled "System and Method for Rapid Thermal Processing," filed Sep 4, 1997, by Stephen E. Savas (the "'661 Application"), U.S. Provisional Patent Application Ser. No. 60/067,299, titled "Systems and Methods for Low Contamination, High Throughput Handling of Workpieces for Vacuum Processing," filed Nov. 28, 1997, by Fred Tabrizi, Barry Kitazumi, David A. Barker, David A. Setton, Leszek Niewmierzycki and Michael J. Kuhlman (the "'299 Application"), U.S. Provisional Patent Application Ser. No. 60/092,563, titled "A Model Based Method for Wafer Temperature Control in a Thermal Processing System for Semiconductor Manufacturing," filed Jul. 13, 1998, by Stephen E. Savas, Martin L. Hammond, Robert Mueller and Jean-François Daviet (the "'563 Application"), and U.S. Provisional Patent Application Ser. No. 60/092,759, titled "Cleaning Process for Rapid Thermal Processing System," filed Jul. 13, 1998, by Stephen E. Savas, Martin L. Hammond and Jean-François Daviet, (the "'759 Application"), each of which is hereby incorporated herein by reference in its entirety.

Referring to FIG. 5, a heated cavity 502 is formed for thermally processing a semiconductor substrate. A heated block 504 provides a heating surface 506 for thermally processing a substrate in the cavity. The heated block may comprise silicon carbide coated graphite in the second embodiment. The heated block is heated by lower resistive heater 508 and side resistive heater 510, each of which may be formed from silicon carbide coated graphite. The side resistive heater 510 is coiled around the sides of the heated block to reduce edge losses and thermal gradients across the block. The heated cavity is enclosed within inner insulating walls 512 and outer insulating walls 514 which act as heat shields. In the second embodiment, the inner insulating walls 512 comprise silicon carbide coated graphite and the outer insulating walls 514 comprise opaque quartz. A semiconductor substrate may be inserted and withdrawn through port 516 for thermal processing. The substrate is placed on pins (not shown) which may be raised and lowered as described in the '986 Application. The substrate may be lowered adjacent to or onto the heating surface 506 for processing. Upon completion of processing, the pins are raised and the substrate is removed through port 516. As described in the '986 Application, such a heated cavity may be enclosed within a cooler outer chamber. Vacuum pressures may be maintained in the heated cavity and outer chamber to reduce convective and conductive heat losses and thereby enhance processing uniformity.

In comparison to the thermal processor of the '986 Application, the thermal processor of FIG. 5 uses a second layer of heat shielding and an additional resistive heater 510 adjacent to the side of the heated block. As a result, the thermal processor of FIG. 5 is able to process semiconductor substrates at high temperatures in excess of 1200° C. with a high level of uniformity. In addition, in contrast to some lamp based systems, the thermal processor design illustrated in FIG. 5 is readily scalable to accommodate 300 mm and larger substrates.

In the thermal processor of the second embodiment, rapid insertion and removal of semiconductor substrates from the heated cavity may be used to reduce or eliminate plastic deformation. For instance, with processing temperatures of from about 900° C. to 1200° C., substrate withdrawal speeds may range from about 0.3 to 2.5 or more meters per second or be at any speed or range subsumed therein. In some embodiments, withdrawal speeds may range from about 0.5 to 1.5 meters per second for 200 mm silicon wafers and from about 0.7 to 2.0 meters per second for 300 mm silicon wafers. As wafer insertion and withdrawal speeds are increased, the size and incidence of plastic deformation defects is reduced until a threshold is reached at which such defects are substantially prevented.

In heated cavity processors using a heating surface, there may be a significant temperature difference between the heating surface and the top of the cavity (e.g., the top of inner insulating wall 512), which may range for instance from 25° C. to 150° C. depending upon the processing temperature and configuration. As a result, the substrate temperature may be cooled as it is moved away from the heating surface for removal. For instance, the substrate may be from 20° C. to 100° C. less than the temperature of the heating surface (which may range from 400° C. to 1200° C. or more depending upon the desired process). Additional techniques may be used to further reduce the substrate temperature, such as removal of the top of the cavity, closing a shutter across the heating surface behind the substrate as it is raised, providing a transitional heat zone or other techniques described in the '661 Application and the '788 Application. Cooling the substrate prior to withdrawal may be used to reduce the withdrawal speed required to maintain a given defect level.

In other embodiments, however, the heated cavity may be made more isothermal. Additional heaters may be provided on top and along the sides of the heated cavity (either inside or outside of one or both sets of insulating walls). In such embodiments, the temperature differences across the cavity (at least for surfaces in radiative thermal communication with the semiconductor substrate) may be reduced to less than about 10° C. to 25° C. As temperature differences are reduced, the thermal processor becomes more like the substantially isothermal RIRTP of the first embodiment and it may not be necessary to move the substrate toward any particular heating surface to achieve a desired equilibrium processing temperature.

In the above described thermal processor configurations, the heated cavity forms a thermal environment which heats the substrate to an elevated temperature prior to withdrawal from the heated cavity. Although the substrate temperature may be reduced substantially below the processing temperature prior to withdrawal, it may still be substantial. Depending upon the processor configuration and processing temperature, the substrate temperature prior to removal may range for instance from about 400° C. to 1200° C., or be at any temperature or range subsumed therein. The outer chamber or other surrounding environment may be at a much lower temperature, for instance 25° C. to 100° C. As a result, the leading edge of the substrate may be exposed to a thermal environment that is from about 300 to 1100 (or any range subsumed therein) or more degrees Celsius cooler than the temperature of the thermal environment to which the trailing edge is exposed. Such a differential causes thermal stress and may lead to plastic deformation.

The temperature and/or reflective properties of the environment to which the substrate is removed may also be adjusted in the exemplary embodiments to reduce thermal stress. The withdrawal speeds described above in connection with FIGS. 2 and 4 assume that a silicon wafer is withdrawn to a cool environment of about 20° C. that absorbs thermal radiation from the wafer. However, the rate of cooling and the level of thermal stress may be reduced if this environment is substantially reflective or is at an elevated temperature itself. This may be achieved by withdrawing the substrate into an antechamber having the desired properties. In such an embodiment, the wafer stresses associated with removal of the wafer are reduced.

In one such embodiment, the antechamber has highly reflective walls above and below the wafer's movement plane which are not spaced very far from the top and bottom surfaces of the wafer (e.g., less than the radius of the wafer). In this case, the wafer's thermal radiation is reflected back to it and the rate of wafer cooling is diminished. Such reflecting walls may be made of reflective metal elements enclosed in quartz. See the '788 Application. This eliminates potential contamination by the reflective metallic material as well as reducing the potential for damage to the reflecting surface by gaseous elements from the process chamber or the wafer. As a result, the wafer removal speed may be reduced in proportion to the reduction in wafer cooling rate while maintaining the degree to which defects are reduced or avoided.

An alternate design employs heated elements in the region just outside the process chamber which are at a temperature somewhat below the heated cavity. Resistively heated elements or infrared heat lamps may be used for this purpose. Radiation from these elements provides heat to the wafer as it exits the heated cavity thereby reducing the cooling rate. If the temperature of the heated elements (whose size may be of approximately the same order as the wafer itself) is equal to, for example, from about 80% to 90% of the process temperature, then the cooling rate is reduced by a significant percentage. This percentage is given approximately by the difference of the fourth power of the temperature ratio (in degrees Kelvin). Thus, if the walls are at 90% of process temperature, the cooling rate is only ~34% of its cold wall value. These values are approximate, because some of the surfaces in radiative communication with the wafer may not be heated to such a degree. Nonetheless, partial heating of the antechamber (for instance to about 70% to 90% of the process temperature) can be used to reduce the cooling rate and decrease the speed at which wafers are removed from the heated cavity for a given defect level.

As described above, rapid insertion and withdrawal speeds may be used in connection with such thermal processors to substantially reduce or prevent plastic deformation. In one exemplary embodiment, the substrate withdrawal speeds are selected such that the amount of time that any two portions of the substrate (typically leading and trailing edges of the substrate) are exposed to a thermal differential of a given magnitude is limited as set forth below in Table 4. A range of times is given for the limits of exposure for a given differential. Any time limit in the range may be selected depending upon the substrate properties and desired or tolerable levels of defects. The lower end of the ranges are expected to result in reduced defects relative to the upper end of the ranges.

TABLE 4

| Temperature Differential of Environments | Time of Exposure |
| --- | --- |
| 500 degrees Celsius | less than about 1–2 seconds |
| 600 degrees Celsius | less than about 1–2 seconds |
| 700 degrees Celsius | less than about 1–2 seconds |
| 800 degrees Celsius | less than about 1–2 seconds |
| 900 degrees Celsius | less than about 0.8–1.2 seconds |
| 1000 degrees Celsius | less than about 0.4–0.6 seconds |
| 1100 degrees Celsius | less than about 0.2–0.4 seconds |
| 1200 degrees Celsius | less than about 0.1–0.3 seconds |

In other exemplary embodiments, a semiconductor substrate may be exposed to any of the temperature differentials described in the above table; however, the withdrawal speed may be selected such that the temperature difference actually realized between any two portions of the substrate due to withdrawal does not exceed 10° C. to 20° C. In other embodiments, the limit on such temperature difference may be set at 30° C., 40° C., 50° C., 75° C., 100° C. or more depending upon the substrate properties and desired or tolerable levels of defects. The criteria set forth above and in Table 4 are approximate limits that may be useful in certain exemplary embodiments of the present invention, but are not intended to reflect particular defect thresholds which may depend upon wafer properties and other factors. Rather, specific equations and relationships are described below which more accurately predict thresholds for thermal stress and plastic deformation. Nonetheless, the above limits are useful to describe certain exemplary embodiments and may be applied whether the substrate is 200 mm, 300 mm or 400 mm and whether or not the substrate is cooled below the processing temperature prior to withdrawal.

By increasing wafer withdrawal speed as described above, plastic deformation may be substantially reduced or eliminated. For instance, with a given furnace configuration, processing temperature, and wafer size, withdrawal of the wafer at 0.1, 0.2 or 0.3 meters per second may result in plastic deformation (whether after a single or multiple process cycles). At low speeds, multiple slip lines with a length greater than 3 mm may form. However, if the withdrawal speed is doubled or tripled, the number and severity of defects may be substantially reduced or eliminated. At speeds of perhaps 0.4, 0.5, 0.7 or 1.0 meters per second under the same conditions, slip lines with a length greater than 3 mm may be eliminated. Of course the particular speeds at which defects are formed and eliminated will vary depending upon a variety of conditions (described further below).

In some embodiments, it is desirable to use wafer withdrawal speeds above those of conventional systems, but below the threshold level at which plastic deformation is substantially eliminated. As withdrawal speed increases, the size and type of defects changes. At certain intermediate speeds, only point-like defects (with length much less than 100 microns) are formed. Such defects may be tolerated in some applications and the speeds may be substantially less than required to prevent plastic deformation. For 200 mm silicon wafers at about 1200° C., this range is expected to start at a withdrawal speed of around 0.4–0.5 meters per second as opposed to the 1.1–1.3 meter per second range required to substantially avoid plastic deformation. Thus, operating in the intermediate speed range may allow simplified wafer transport mechanisms to be used while still providing commercially viable results.

A wafer transport robot with increased retraction speed may be used to withdraw wafers from the heated cavity in the exemplary embodiments. An exemplary wafer transport robot is described in the '299 Application. As described below, however, thermal stress due to preferential heating or cooling at the edge of the wafer may be significant. As a result, a wafer carrier, slip ring or other shield may be required to reduce edge stress and the end effector of the robot described in the '299 Application may be modified for the exemplary embodiments to accommodate a wafer carrier or slip ring.

The use of a slip ring is important for reducing thermal gradients at the wafer edge upon removal from the heated cavity. The ring surrounds the edge of the wafer, acts as a heat shield, and can also be a component of a wafer-carrier mechanism which permits a high degree of acceleration to be imparted to the wafer for withdrawal from the heated cavity at high speed (e.g., >0.5 m/sec or more) while preventing the wafer from sliding out of position on the "end effector" of the wafer transport robot. Thus, the slip rings can serve a dual purpose-providing a stable holder for the wafer and preventing overly rapid cooling of the wafer edge. In order not to contaminate the silicon wafers, these rings are made from an ultraclean high temperature compatible material such as quartz, silicon carbide, silicon or graphite (commonly silicon carbide coated) which have a very low concentration ($<10^{10}$ atoms/cm$^2$) of any metallic element on the surface.

A first exemplary wafer carrier is shown at 130 in FIG. 1. Wafer carrier 130 may serve three important purposes in exemplary embodiments of the present invention. First, it provides full support around the wafer perimeter, thus reducing gravitational stresses in the wafer to a large extent. Such perimeter support is expected to produce maximum gravitation stresses in the wafer that are about a factor of two below those for more conventional three-point supports in which the support points are located at about 60% of the wafer radius, and is expected to reduce these stresses by more than a factor of five below conventional three-point support in which the support points are located at the wafer edge. Moreover, the full edge support provided by the wafer carrier produces a maximum gravitational stress that is located at the wafer center, rather than at the support locations. This is beneficial because the maximum thermal stresses due to nonuniform wafer temperatures typically occur near the wafer edge. Thus the maximum combined thermal and gravitational stress is further reduced by the full edge support of the wafer carrier by placing the maximum thermal stress and maximum gravitational stress at different physical locations on the wafer.

The second important role of wafer carrier 130 is to provide a radiation shield for the wafer edge. Because of the additional surface area associated with the wafer edge, the silicon in the vicinity of an unprotected edge will heat or cool more quickly than the remainder of the wafer when the wafer is rapidly inserted into or withdrawn from the heated cavity. The resulting temperature variation near the wafer edge gives rise to thermal stresses in the vicinity of the edge, and these stresses contribute to the total wafer stress. If the total stress exceeds the temperature-dependent yield stress of the silicon, defects in the silicon will be produced. In addition, the greater the excess of the total stress above the yield stress the greater the rate of growth of the defect size. Thus shielding the wafer edge from this enhanced heating or cooling and thereby reducing the edge stress is important to both defect-free and limited-defect wafer processing.

The third function of the wafer carrier is to present a more spatially uniform thermal load to the interior of the heated cavity. Much of the energy required to heat the wafer is extracted from the heat capacity or thermal mass of the cavity walls when the wafer is inserted into the cavity. As a result, the cavity walls adjacent to the wafer may be cooled a few degrees. If only a wafer is inserted into the cavity, this will produce a cool spot on the top and bottom cavity walls matching the wafer shape. The cavity walls outside this spot will remain at higher temperatures and so will produce somewhat higher wafer temperatures near the wafer edge. Because very uniform wafer temperatures are optimum for wafer processing, this situation is undesirable. To avoid this localized cooling of the cavity walls, the shape of the wafer carrier is made to resemble the plan-view shape of the cavity and the areal thermal mass (thickness times specific heat) and emissivity of the carrier are selected to match those of the wafer. For instance, the wafer carrier may be a flat sheet with a thickness within a factor of four of the wafer. The sheet may have a hole in the center in which the wafer is held on small fingers or other edge supports. The wafer carrier may extend a distance beyond the edges of the wafer that is at least equal to one half the height of the cavity (i.e., the diameter of the wafer carrier with the wafer is at least equal to the diameter of the wafer plus the height of the cavity). In this manner, the cavity walls adjacent to the carrier experience the same temperature depression as do those adjacent to the wafer, and both the cavity walls and wafer temperatures remain more uniform as the wafer and carrier are inserted into the cavity.

Figure 6A:
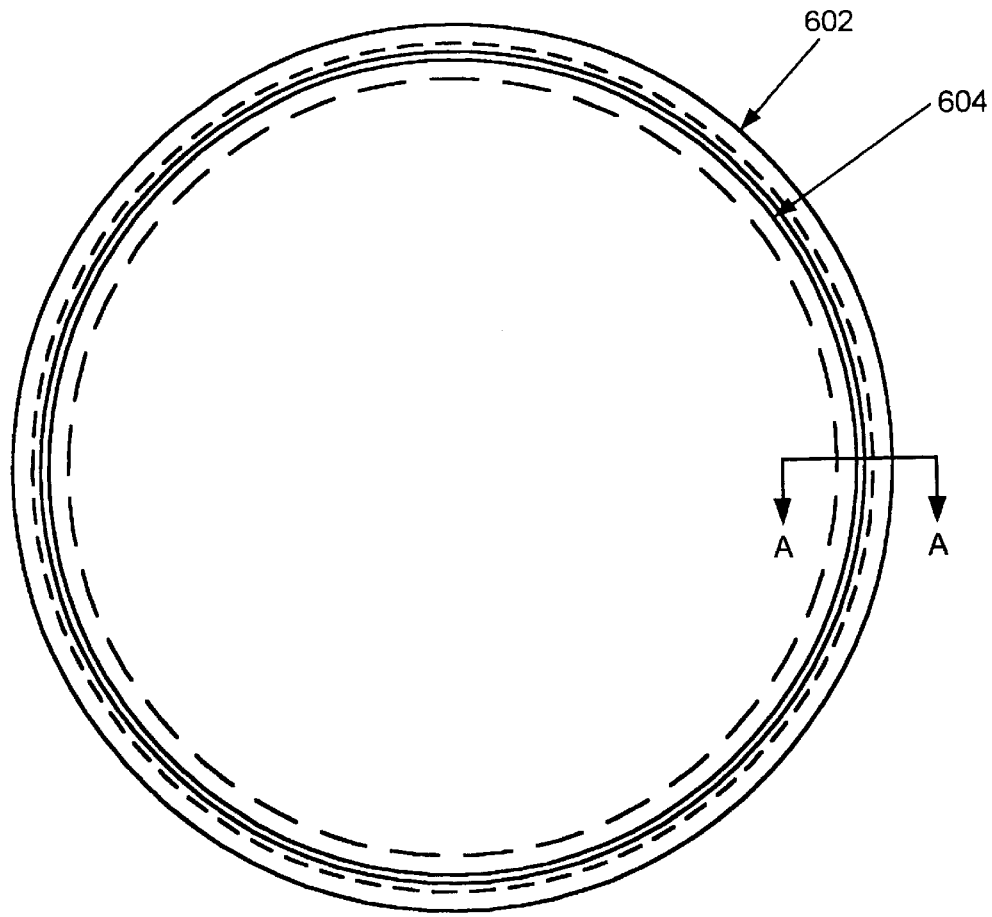
FIGS. 6A and 6B are a bottom view and a partial side cross section view of a slip ring which may be used in connection with exemplary embodiments of the present invention.
Figure 6B:
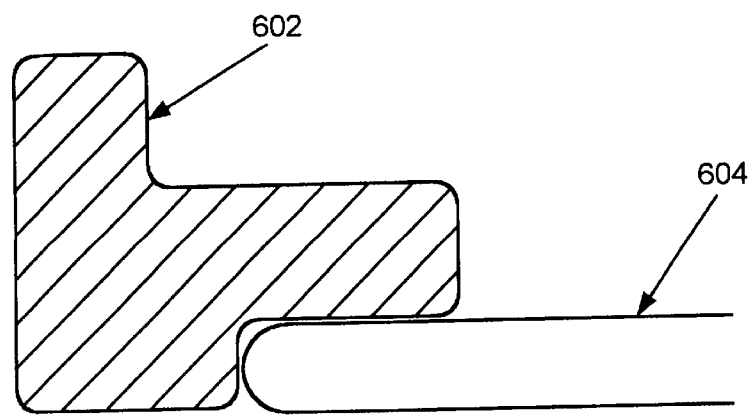

An exemplary slip ring is shown in FIGS. 6A and 6B. FIG. 6A is a bottom view, and FIG. 6B is a partial side cross section (along section A—A), of a simple slip ring 602 that was used for testing aspects of the present invention in a thermal processor according to the second embodiment. This ring was constructed of opaque quartz and was very thin and small in mass. The ring 602 was placed on top of wafer 604 prior to insertion into the process chamber and was left on in the processing chamber while the wafer was heated. After processing, the wafer 604—with the ring 602 surrounding and held on its top edge—was removed from the chamber using the Aspen II wafer transport robot available from Mattson Technology, Inc. Because of the presence of the slip ring the edge of the wafer cooled at nearly the same rate as the interior of the wafer. The results of tests conducted with this configuration are described further below.

Figure 7A:
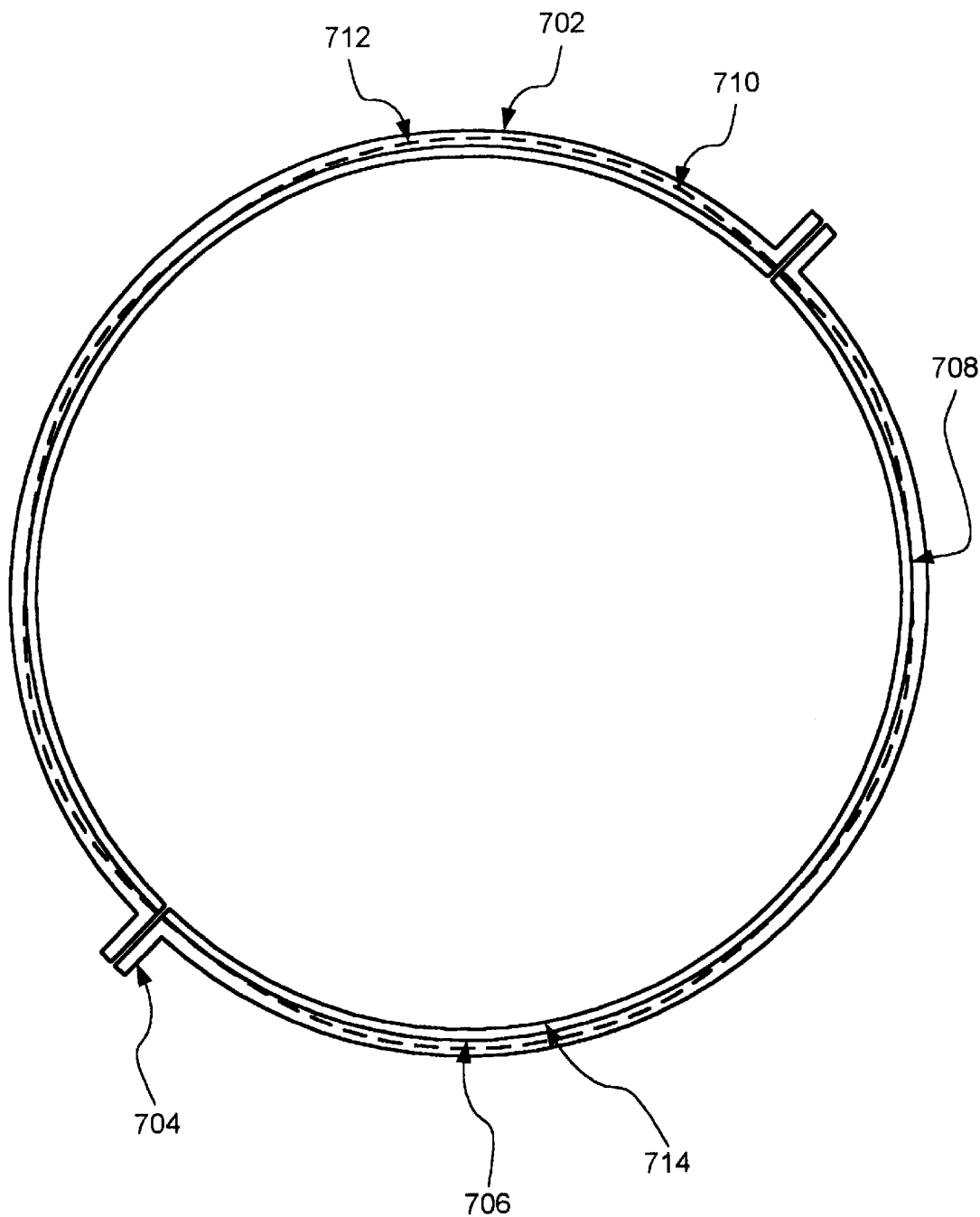
FIG. 7A is a top view.
Figure 7B:
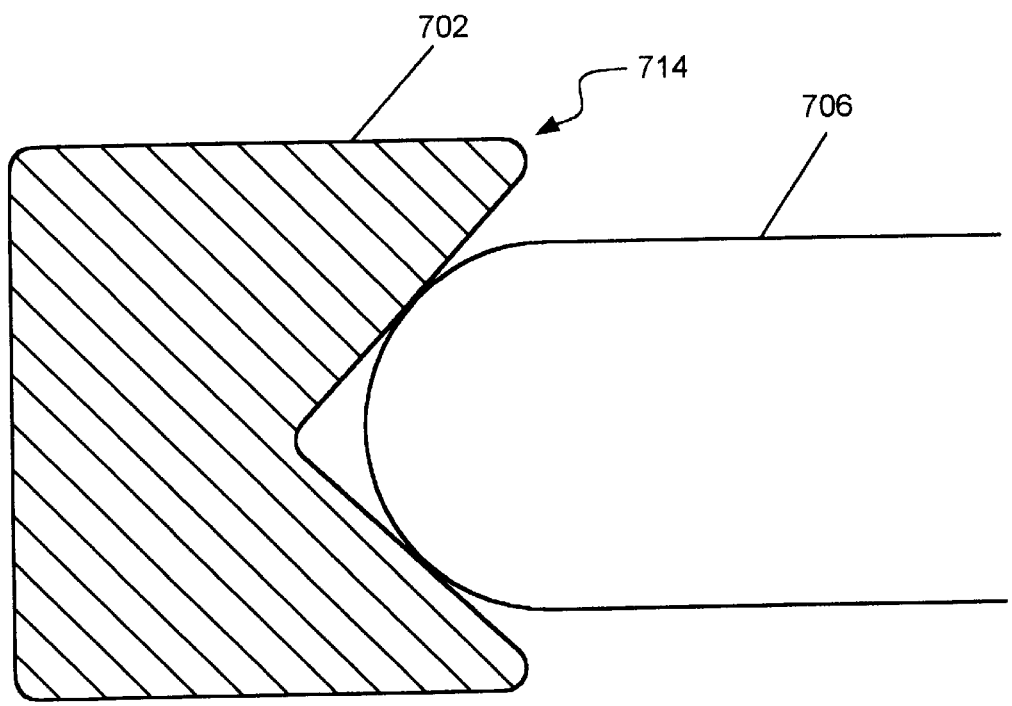
FIG. 7B is a partial side cross section view, of a slip ring which may be used as part of a substrate carrier in accordance with exemplary embodiments of the present invention.

Another exemplary slip ring is shown in FIGS. 7A and 7B. FIG. 7A is a top view, and FIG. 7B is a partial side cross section, of a slip ring 702 that may be used as part of a wafer carrier in the exemplary embodiments of the present invention. Slip ring 702 includes brackets 704 to interlock with the end effector of the wafer transport robot to allow the wafer 706 to be grasped firmly on its edge prior to insertion or removal from the chamber. This allows the wafer to be rapidly accelerated to high speeds for insertion and/or removal. The ring 702 is attached to the wafer 706 and, prior to insertion of the wafer into the chamber, the brackets 704 at the ends of the two halves of the ring are fastened. The size and shape of the ring when fastened are such that there is some room left for expansion of the wafer (as it reaches high temperature within the process chamber) to fill up the interior of the ring and be tightly held in the ring as the wafer expands relative to the ring. As shown in FIG. 7A, the wafer is in contact with the slip ring at only a few points (such as 708 and 710, but not 712). FIG. 7B shows a cross section of ring 702 at a point of contact with wafer 706. As shown at 714 in FIGS. 7A and 7B, the inner edge of the slip ring extends over the outer edge of the wafer. Thus, the ring is in excellent circumferential conformance with the wafer edge at high temperature, and thus upon removal when the high acceleration is needed.

In order to remove the wafer upon completion of the process the end effector of the robot is moved into the process chamber and the provided grasping points of the ring are latched by the grasping attachments to the end effector.

Figure 8A:
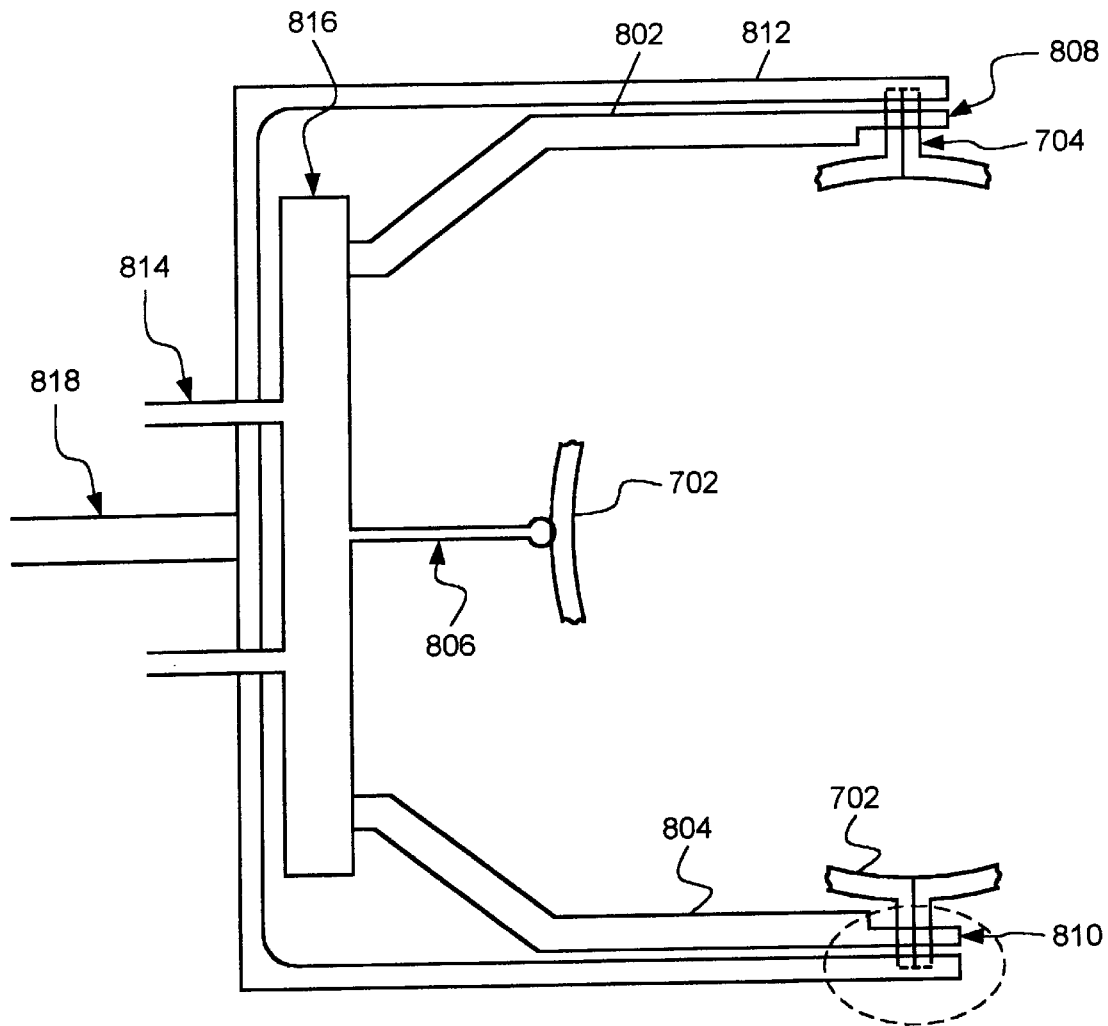
FIG. 8A is a top view.
Figure 8B:
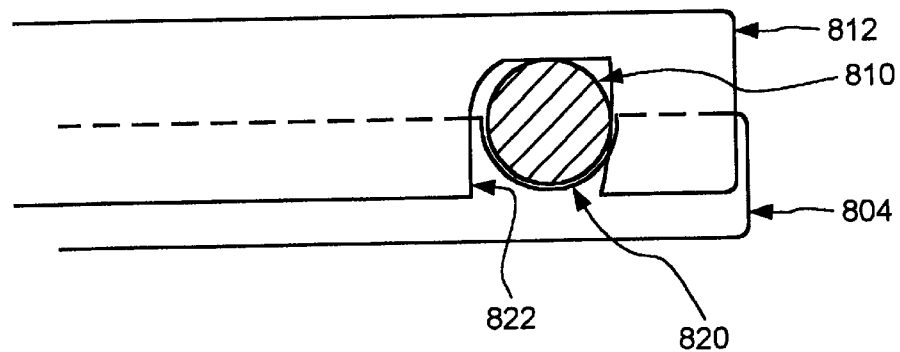
FIG. 8B is a partial side view, of a substrate carrier according to an exemplary embodiment of the present invention which may be used in connection with the slip ring of FIGS. 7A and 7B.

FIG. 8A is a top view, and FIG. 8B is a partial side view, of a substrate carrier, generally indicated at 800, according to an exemplary embodiment of the present invention. The wafer carrier may be used to form the end effector of a wafer transport robot in the second embodiment. The substrate carrier has support arms 802 and 804 for supporting slip ring 702 and the wafer. For ease of illustration, only partial sections of slip ring 702 in contact with support arms 802, 804 and 806 are shown. The ends of support arms 802 and 804 are notched at 808 and 810 respectively to securely receive brackets 704. In addition, a structure 812 also assists in clamping to the brackets 704 and allows high acceleration for insertion and/or removal. The substrate carrier also comprises a support shaft 814 for the base of the end effector 816 and a support shaft 818 for structure 812 which permits it to be raised, lowered and secured.

FIG. 8B is a partial side view of structure 812 and support arm 804 illustrating the mechanism for clamping to bracket 704. As shown in FIG. 8B, a notch 820 is formed in support arm 804. A symmetric notch 822 is formed in structure 812. When structure 812 is positioned over bracket 704, the two notches 820 and 822 effectively secure bracket 704 for insertion and/or withdrawal of the slip ring and wafer.

Once grasped the wafer is supported firmly both laterally and vertically against gravity by the slip ring and may be accelerated rapidly parallel to its surface through the slit door opening of the process chamber. As the wafer is being removed, the wafer and ring cool at almost the same rate and the wafer is thus kept from experiencing excessive cooling at its edge due to the heat shielding provided by the ring. The ring provides heat shielding for the wafer edge (see FIG. 7B for a cross section) while not touching the edge except at a number of separated points due to the lack of perfect circularity of the inner edge of the ring. This lack of circularity and limited number of points of contact of wafer with ring are instrumental in allowing the wafer to remain firmly held even as it cools, since the thermal expansion coefficient of silicon is greater than that of quartz, silicon carbide or graphite. The ring may be also made of silicon but this may cause problems with contact welding of the slip ring and wafer at contact points. As the wafer is removed from the process region it cools and shrinks and that shrinkage makes it retract along most of its circumference from the slip ring. However, the slight springiness of the slip ring and the lack of circularity cause the ring to "spring back" toward its original shape (which is not circular) while continuing to be in firm contact with the edge of the wafer at the contact points. Once the wafer is completely out of the process chamber and has cooled slightly, the wafer will have shrunk by about a millimeter relative to the ring and the force required to unclamp the two (or more) parts of the slip ring is reduced. The ring is unclamped and detached from the wafer and can be re-used with a subsequent wafer. Such ring(s) are kept in the wafer handling region of the processing system in a very clean environment so as to remain free of contaminant materials and particulates.

Figure 9A:
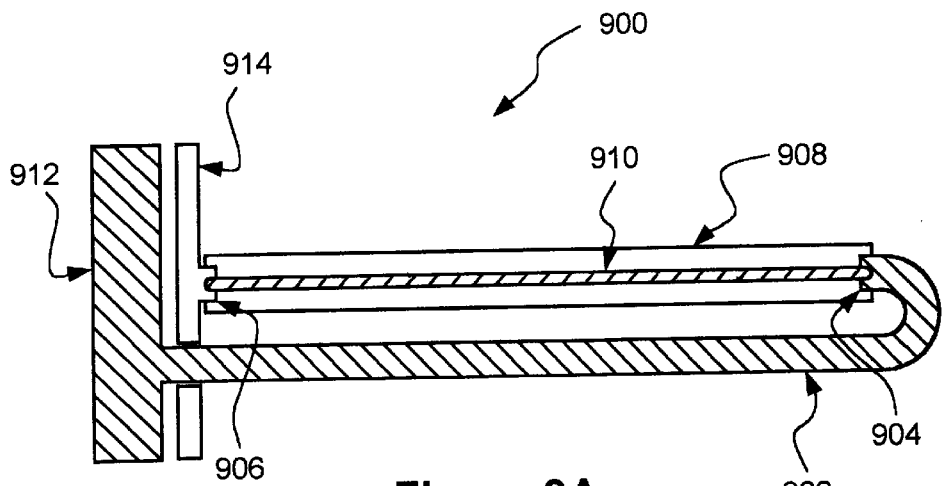
FIG. 9A is a side cross section view.
Figure 9B:
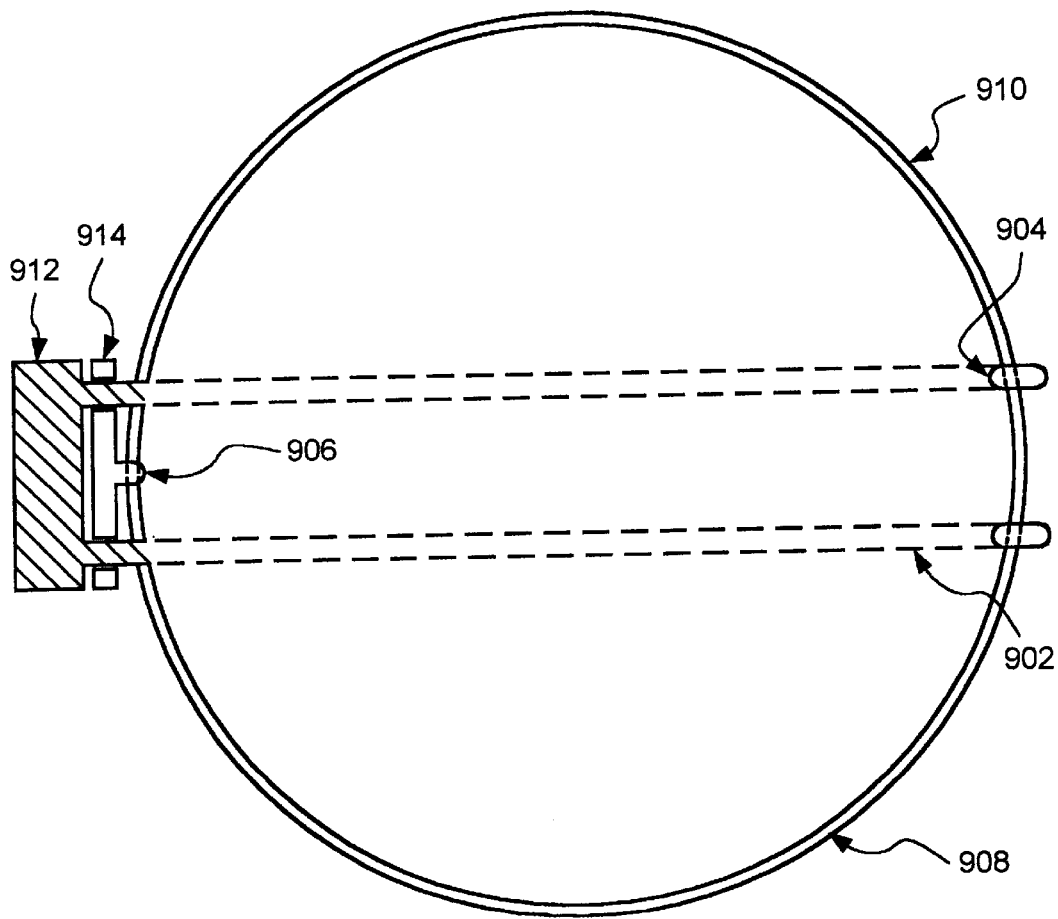
FIG. 9B is a top view, of an alternate substrate carrier and slip ring according to an exemplary embodiment of the present invention.

FIG. 9A is a side cross section, and FIG. 9B is a top view, of a substrate carrier, generally indicated at 900, according to an alternate exemplary embodiment. The substrate carrier utilizes two (or possibly more) narrow rods 902 with notched ends 904 for grasping the edge of the wafer 910 furthest from the load lock. The rods comprise quartz, silicon carbide or another non-contaminating high temperature material. The substrate carrier also has a notch 906 for holding the opposite edge of the wafer 910. The rods are spaced a few inches apart (as much as several inches apart) and are of such length that they pass underneath the wafer from the base of the end effector, and come up on the far side of the wafer where they are notched to be able to grasp the wafer. These rods are retracted in order to grasp the wafer at one point on its edge only, so as to minimize particulate generation which is caused by scraping or rubbing contact between objects. There is another independent piece 908 which is a circular band of minimal (~1 mm) thickness and about 6 mm or slightly more in height which is round and slightly larger diameter than the wafer and positioned just outside the edge of the wafer thereby acting as a radiation shield or "slip ring." This prevents excessive rapid radiative cooling of the wafer edge, which might cause crystallographic slip at the very edge of the wafer. The substrate carrier also has an actuator plate 912 for controlling movement of the rods and a base plate 914 for the end effector.

The above description is illustrative of several possible exemplary embodiments of the present invention. The present invention is not limited, however, to the specific processor designs and parameters of operation set forth above.

Rather, the general principles described herein may be applied in any variety of processor configurations and processes. Below are described general principles and relationships which may be used to predict and control plastic deformation. In particular, insertion and withdrawal speeds for a semiconductor substrate may be selected in accordance with the equations set forth below to limit or prevent plastic deformation defects in a wide variety of processor configurations across various processes and substrate types and sizes.

Defects in the silicon wafer are produced whenever the total stress in the wafer at a given temperature exceeds the yield stress at that temperature. Thus for defect-free wafer processing, the instantaneous total stress must never exceed the temperature-dependent yield stress. For limited defect generation, the final defect size is proportional to the excess of the total stress above the yield stress and grows in proportion to the time over which the yield stress is exceeded. Thus for limited-defect wafer processing, the yield stress may be exceeded, but the duration and magnitude of the excess stress must be low enough such that only defects of acceptable length are produced.

Figure 10:
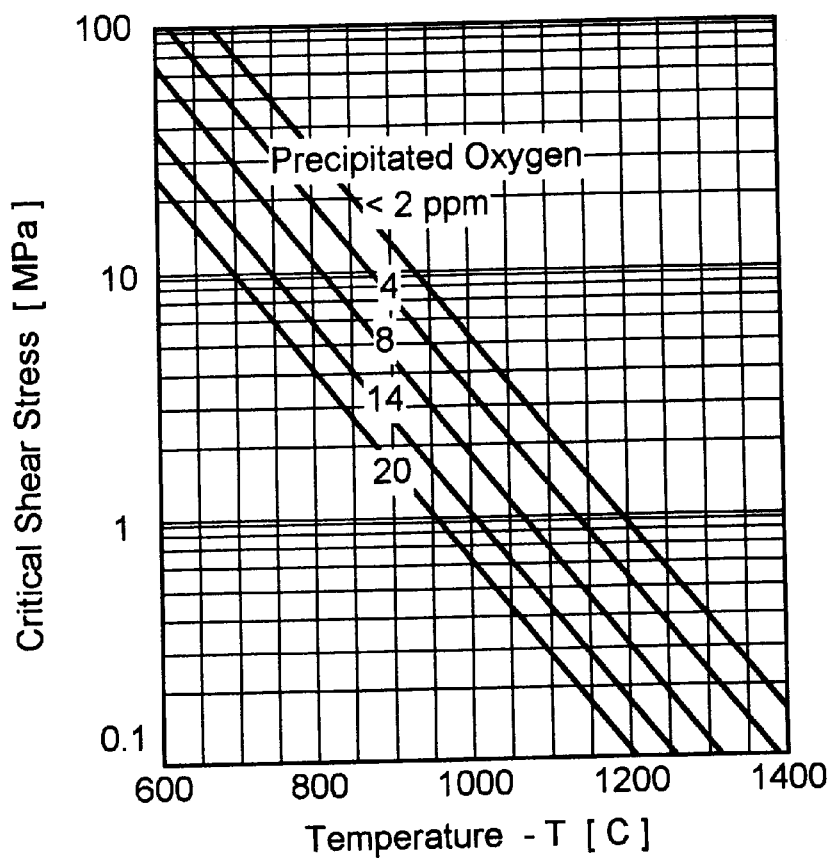
FIG. 10 is a prior art graph illustrating the critical shear stress of silicon at various temperatures and levels of precipitated oxygen.

The yield stress of silicon is strongly dependent on temperature, as well as the concentrations of interstitial and precipitated oxygen. As shown in FIG. 10, the critical shear stress decreases by about two orders of magnitude as the temperature increases from 600° C. to 1200° C. The five solid lines indicate that an increase in precipitated oxygen concentration from 2 to 20 ppm may reduce the yield stress by an order of magnitude. The temperature dependent yield stresses shown in FIG. 10 may be approximated by Equation 1 below:

$$\sigma_y = \frac{516}{1 - 1.2[O_p]} e^{-T/111}$$

where the yield stress is given in GPa, the temperature is in Kelvin, and the precipitated oxygen concentration, [Op], is in ppm.

The total stress in the silicon wafer arises from two primary sources: (1) gravitational stress due to the wafer weight and support geometry; and (2) thermal stress due to temperature variations across the wafer. These stresses have been computed using finite difference numerical methods for a wide range of furnace temperatures, insertion and withdrawal speeds, wafer diameters, and other operating parameters in order to determine desired insertion and withdrawal speeds. The following approximations provide a relatively simple set of scaling guidelines instructive in determining the desired speeds for various exemplary embodiments.

Gravitational stresses grow in proportion to the square of the wafer diameter and are inversely proportional to the wafer thickness. These stresses also depend on the geometry of the wafer support, but are independent of the wafer temperature. The maximum gravitational stress at any point on the wafer may be expressed as shown in Equation 2 below:

$$\sigma_g = \sigma^* \frac{d^2 \rho g}{t}$$

where d is the wafer diameter, $\rho$ is the density of silicon, g is the gravitational constant, t is the wafer thickness, and $\sigma^*$ is an order one constant that depends on details of the wafer support geometry. See R. H. Nilson and S. K. Griffiths, *Thin Solid Films*, 315, 286, 1998, which is incorporated herein by reference. Because wafer thickness increases only slightly with increasing wafer diameter, gravitational stresses increase rapidly with increasing wafer size. Gravitational stresses for 150 mm wafers are usually negligible; these stresses for 200 mm wafers are usually a small but non-negligible fraction of the thermal stress; for 300 mm and larger wafers, gravitational stresses may equal or even exceed the thermal stresses.

Thermal stress in the exemplary embodiments may be categorized as arising from two sources: (1) temperature variations between the leading and trailing edges of the wafer as the wafer is inserted or withdrawn from the cavity; and (2) temperature variations due to preferential heating or cooling of the wafer edge due to the increased area available for heat transfer. In both of these categories, heat transfer from or to the wafer is dominated by radiative exchange with the cavity or ambient environment, so temperature differences across the wafer show a very strong dependence on the wafer or cavity temperature.

Figure 11:
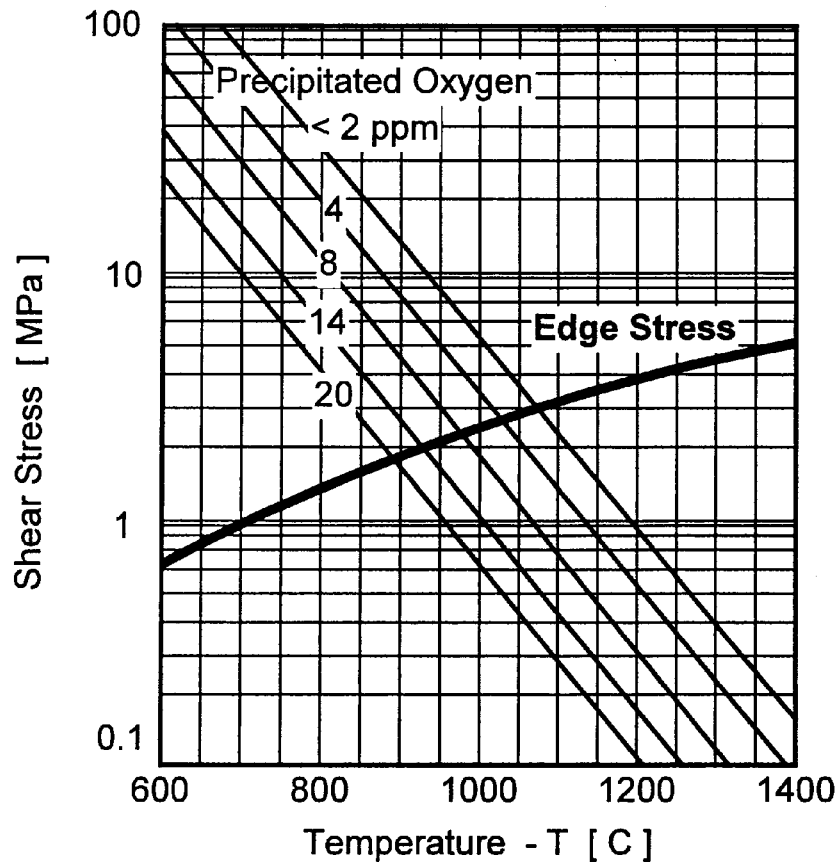
FIG. 11 illustrates the prior art graph of FIG. 10 with an additional plot of computed edge stresses at various temperatures.

Preferential heating or cooling of the wafer edge and the associated edge stresses will generally depend on the speed of insertion and withdrawal and the geometric details of the cavity and its entrance. However, once these speeds exceed a few tenths of a meter per second, the edge stress reaches a maximum value and thereafter becomes independent of the wafer speed and cavity geometry. In this limit, the maximum stress due to edge cooling can be approximated by the relation shown in Equation 3 below:

$$\sigma_e = \frac{\alpha E}{12} \left[ \frac{\varepsilon \gamma T^5 t}{2k} \right]^{1/2}$$

$$E = \frac{1}{0.0077 + 1.49 \times 10^{-6} \mathbb{E}^{T/136}}$$

$$k = \frac{88700}{T^{1.15}}$$

where $\alpha$ is the coefficient of thermal expansion of silicon, E (GPa) is the temperature-dependent elastic Young's modulus, $\varepsilon$ is the wafer emissivity, $\gamma$ is the Stefan-Boltzmann constant, k (W/mK) is the temperature-dependent thermal conductivity of silicon, and T is the furnace (wafer) temperature (in degrees Kelvin). A plot of computed edge stresses, along with the yield stress from FIG. 10, is shown in FIG. 11. As shown in FIG. 11, stresses due to edge cooling become significant at cavity temperatures of about 800° C. At cavity temperatures much in excess of 900° C., stresses due to edge cooling alone may exceed the yield stress and thereby produce defects in the wafer. For the case of defect-free processing, stress that arises from edge cooling must therefore be reduced by some means that mitigates edge cooling and heating when the desired wafer processing temperature is large. To this end, exemplary embodiments of the present invention may employ either a circumferential ring or a wafer carrier to shield the wafer edge from excess radiative heat transfer.

Temperature variations between the leading and trailing wafer edges result from the fact that during insertion and withdrawal portions of the wafer surface are simultaneously exposed to both the high chamber temperature and to the lower ambient temperature of the surroundings. This gives rise to a nonlinear temperature variation between the leading and trailing edges of the wafer, generally producing maximum stresses when the wafer is about half-way into or out of the cavity. The location of these maximum stresses is expected to be near the wafer edges and at 45 degrees off the axis of wafer motion. The magnitude of the peak stress can be approximated by Equation 4 below:

$$\sigma_{iw} \approx \frac{\alpha E}{8} \frac{\varepsilon \gamma T^4}{\rho ct} \frac{d}{U}$$

where U is the speed of insertion or withdrawal. From this relation, it is clear that increasing the speed of insertion or withdrawal reduces the maximum thermal stress and thus is beneficial to either defect-free wafer processing or to controlling the density and length of defects when limited-defect processing is preferred.

For defect-free wafer processing, the sum of the gravitational and thermal stresses should be less than the yield stress of the silicon throughout the wafer temperature history as the wafer is inserted or withdrawn. However, because the yield stress of silicon is severely reduced at elevated temperatures, defects will always first be generated just as the wafer is withdrawn from the cavity, all else being equal. Thus if the desired speed for defect-free processing is based on the speed of withdrawal, this speed will also be sufficient to avoid defect generation upon insertion. For defect-free processing, the desired insertion and withdrawal speed can therefore be approximated by a combination of the above relations as shown in Equation 5 below:

$$U = \frac{\frac{\alpha E}{8} \frac{\varepsilon \gamma T^4}{\rho ct} d}{\frac{516 \times 10^9}{1 - 1.2[O_p]} e^{-T/111} - \frac{\alpha E}{12} \left[\frac{\varepsilon \gamma T^5 t}{2k}\right]^{1/2} - \sigma^* d^2 \rho \frac{g}{t}}$$

From this relation, it is seen that the desired speeds of insertion and withdrawal for defect-free wafer processing depend on the furnace temperature, the wafer diameter and thickness, strength and other properties of the silicon, the gravitational constant, and emissivity of the wafer surfaces.

For cases in which the wafer is well supported and the wafer edges are protected from preferential heating and cooling, the desired speed of insertion increases in proportion to the wafer diameter and is inversely proportional to the wafer thickness. Moreover, the desired speed increases very rapidly with increasing cavity temperature. At high temperatures, this may be approximated by Equation 6 below:

$$U \propto \frac{d}{t} T^4 e^{T/604}$$

Figure 12:
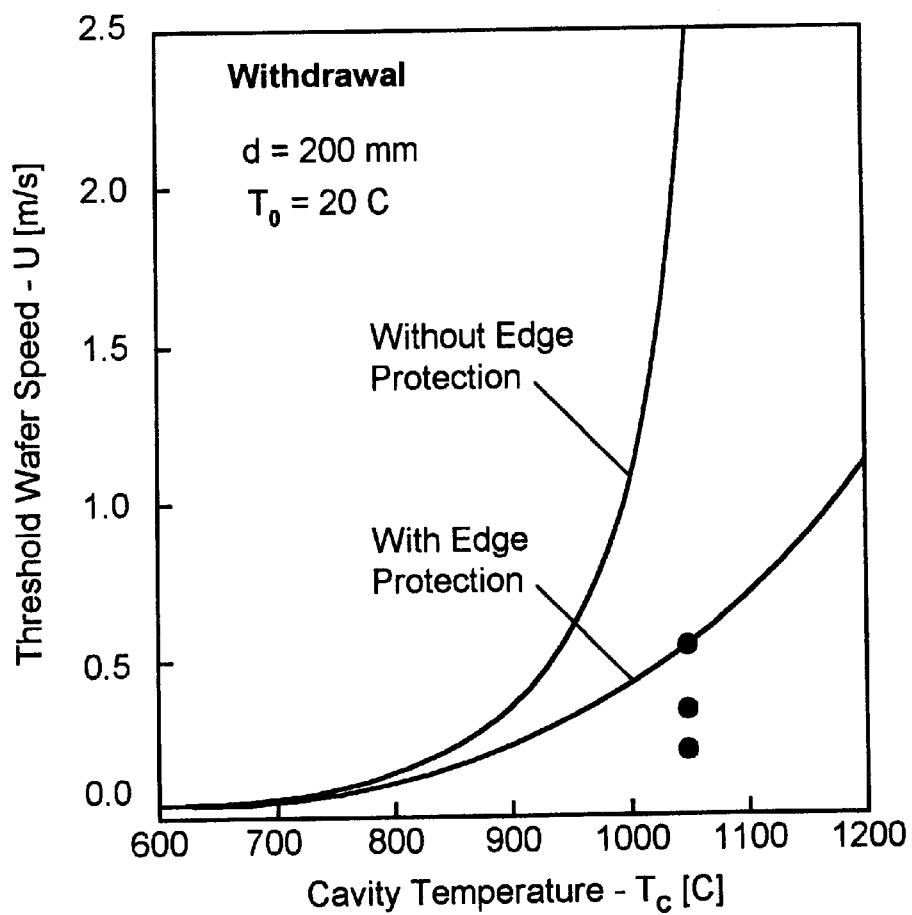
FIG. 12 is a graph comparing desired speeds of withdrawal for a silicon wafer to substantially prevent plastic deformation in an exemplary embodiment of the present invention both with and without a substrate carrier or slip ring to reduce edge stress.

Although this relation indicates that higher cavity temperatures or larger wafers may always be processed in a defect-free manner by further increasing the wafer speed, this is in fact not the case. Edge cooling stresses and gravitational stresses will always be present to some degree, and these eventually lead to an infinite value of the desired wafer speed. At this point, the desired speed increases without bound as the combined edge and gravitational alone just balance the yield stress of the silicon. This is illustrated in FIG. 12, in which computed approximate desired withdrawal speeds for defect-free processing are shown as a function of the cavity temperature. The two curves shown here are for identical conditions except that in one case the edge stress is suppressed by a carrier or ring to eliminate radiative losses from the wafer edge. Table 5 below summarizes the threshold speeds of withdrawal with and without edge protection at various temperatures and shows the corresponding time during which the wafer is exposed to the thermal differential.

TABLE 5

| Temp [° C.] | With Edge Protection | | Without Edge Protection | |
|---|---|---|---|---|
| | Speed [m/s] | Time [s] | Speed [m/s] | Time [s] |
| 600 | 0.02 | 10.00 | 0.02 | 10.00 |
| 700 | 0.05 | 4.00 | 0.06 | 3.33 |
| 800 | 0.12 | 1.67 | 0.14 | 1.43 |
| 900 | 0.24 | 0.83 | 0.36 | 0.56 |
| 1000 | 0.43 | 0.46 | 1.09 | 0.18 |
| 1100 | 0.72 | 0.28 | — | — |
| 1200 | 1.16 | 0.17 | — | — |

The edge protection reduces the desired speed for defect-free processing by about a factor of three at a cavity (wafer) temperature of 1050° C.

Figure 13A:
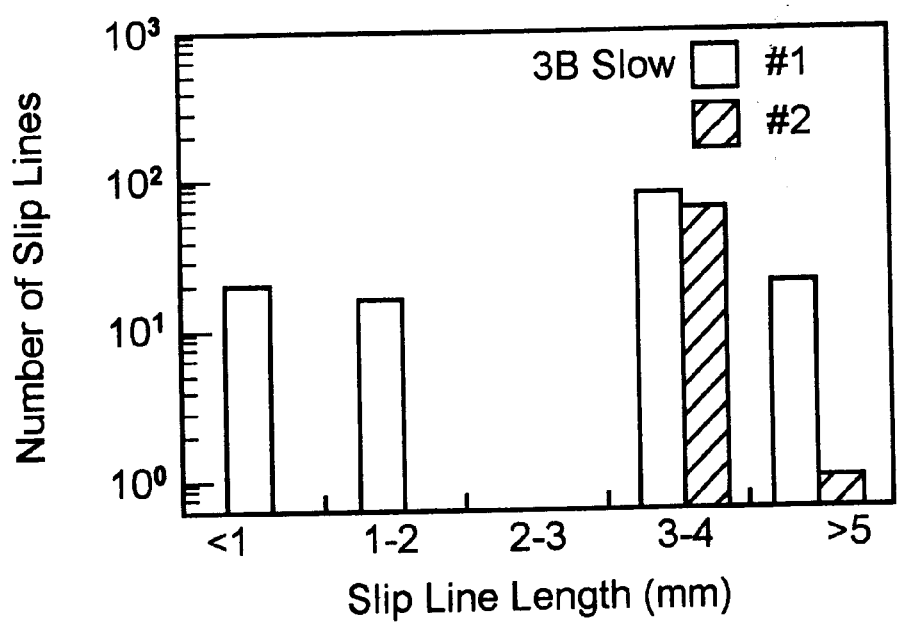
FIGS. 13A and 13B are graphs illustrating the number and length of slip lines observed for different speeds of withdrawal of a silicon wafer without edge protection in an exemplary embodiment of the present invention.
Figure 13B:
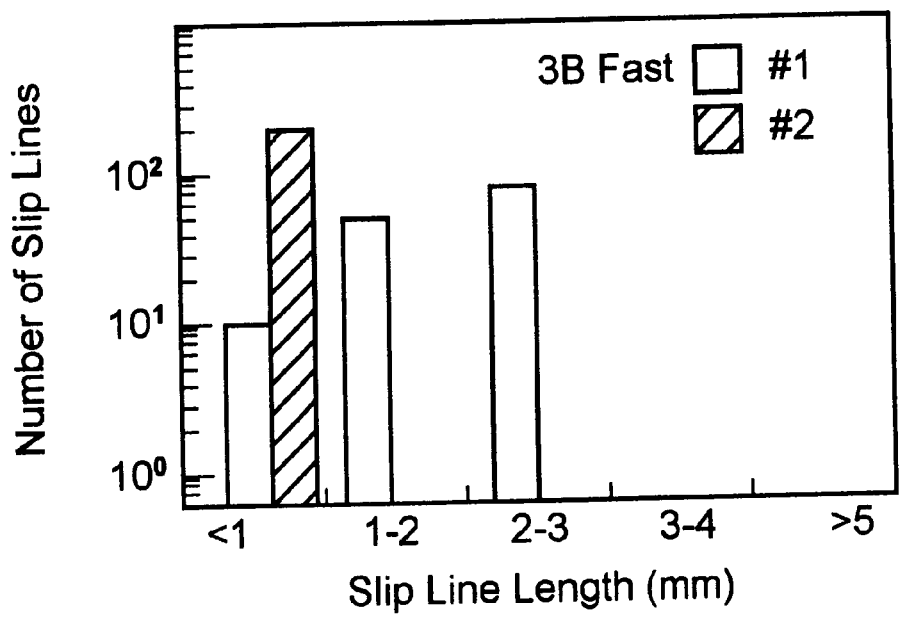

The symbols shown in FIG. 12 indicate conditions at which some tests were performed using 200 mm wafers for 2–3 passes through the processing chamber. The results of such tests for two wafers (indicated as #1 and #2) are shown in FIGS. 13A and 13B. FIG. 13A shows the defect profile for two wafers after withdrawal at low speed. FIG. 13B shows the defect profile for two wafers after withdrawal at a higher speed. During these tests, the perimeter of the wafers was not protected by a slip ring or other thermal shield. The results of these tests indicate withdrawal at low speeds (0.2 m/s) results in a large number of line defects extending to lengths above 3 mm. When speeds are increased to more than about 0.3 m/s these longer defects vanish. These longer defects result from thermal stresses induced by temperature differences between the leading and trailing wafer edges, and so become less prevalent as the wafer speed is increased. This interpretation of the test results is supported by the observation that location of these line defects coincided with the location of the computed maximum stress due to temperature differences along the axis of wafer motion. Since these tests involved no edge protection, increasing the wafer speed slightly increased the incidence of point defects along the wafer edge, consistent with the expectation that edge stresses are confined to a very small region near the wafer perimeter.

Tests were also conducted using the slip ring shown in FIGS. 6A and 6B. The slip ring caused the perimeter of the wafer to cool at nearly the same rate as the interior of the wafer and thus, the slip lines observed were due almost entirely to the stresses caused by the temperature differential from the leading edge of the wafer (which exits the heated cavity first and hence is colder) and its trailing edge.

With this configuration, tests were conducted in the ASPEN RTP system, available from Mattson Technology, Inc., using 200 mm wafers with temperatures prior to removal of about 1100° C. A furnace configuration substantially the same as that shown in FIG. 5 was used. The ordinary speed of the robot used with the ASPEN RTP system is about 0.2 meters per second. Three series of tests were conducted with high quality silicon wafers, with the wafer removal speed from the heated cavity ranging from 1½ normal speed to ¼ of normal speed.

For wafer removal speeds from about 0.1 m/sec through about 0.3 m/sec, the wafers showed slip lines at the edge only, and only when they were cycled through the RTP chamber two or more times. The wafers were high quality with very low precipitated oxygen concentration. Wafers with more precipitated oxygen might have shown more slip. For single heat treatment cycles at these speeds, the wafers typically showed only point-like dislocations at the very edge of the wafer. These point-like defects were only visible under x-ray diffraction, and were not visible under a microscope. For wafer removal speeds somewhat slower—about 0.03 m/sec—it was found that the slip lines at the wafer edge were visible under the microscope, had significant length (>1 cm) and were large in number, of order 100, for even a single pass of the wafer through the RTP chamber.

Because point defects near the wafer edge may not adversely impact device yield from a wafer, and because defect-free processing may not always be the most practical approach, wafer insertion and withdrawal speeds generating limited defects may be desirable. In this approach, the desired wafer speed may be lower than that for defect-free processing and the combined gravitational and thermal stresses may be permitted to exceed the silicon yield stress at least for some period of time. Under these conditions, the rate of growth of defect lengths may be estimated as described below.

Because the wafer cools very rapidly and because the apparent activation energy for defect growth is very large, the time available for defect growth is roughly the time of withdrawal. As such, the ultimate defect length can be approximated by Equation 7 below:

$$l = \frac{bd}{U}(\sigma - \sigma_y)e^{-2666/T}$$

where $\sigma$ is the combined thermal and gravitational stress and $b=0.005$ m/s/Pa provides a reasonable approximation to observed test results. Thus the expected maximum defect length should be proportional to the wafer diameter and inversely proportional to the wafer speed of withdrawal when the combined stress just exceeds the yield stress. When the combined stress far exceeds the yield stress, then the defect length should vary as shown in Equation 8 below:

$$l = \frac{\alpha E}{8}\frac{\varepsilon \gamma T^4}{\rho c t}\left(\frac{d}{U}\right)^2 be^{-2666/T}$$

In this limit the defect length should increase in proportion to the square of the wafer diameter and inversely proportional to the square of the wafer speed. Thus for a given choice of the acceptable defect length, this relation (or that above) can be inverted to obtain an estimate of the corresponding desired wafer speed.

Figure 14:
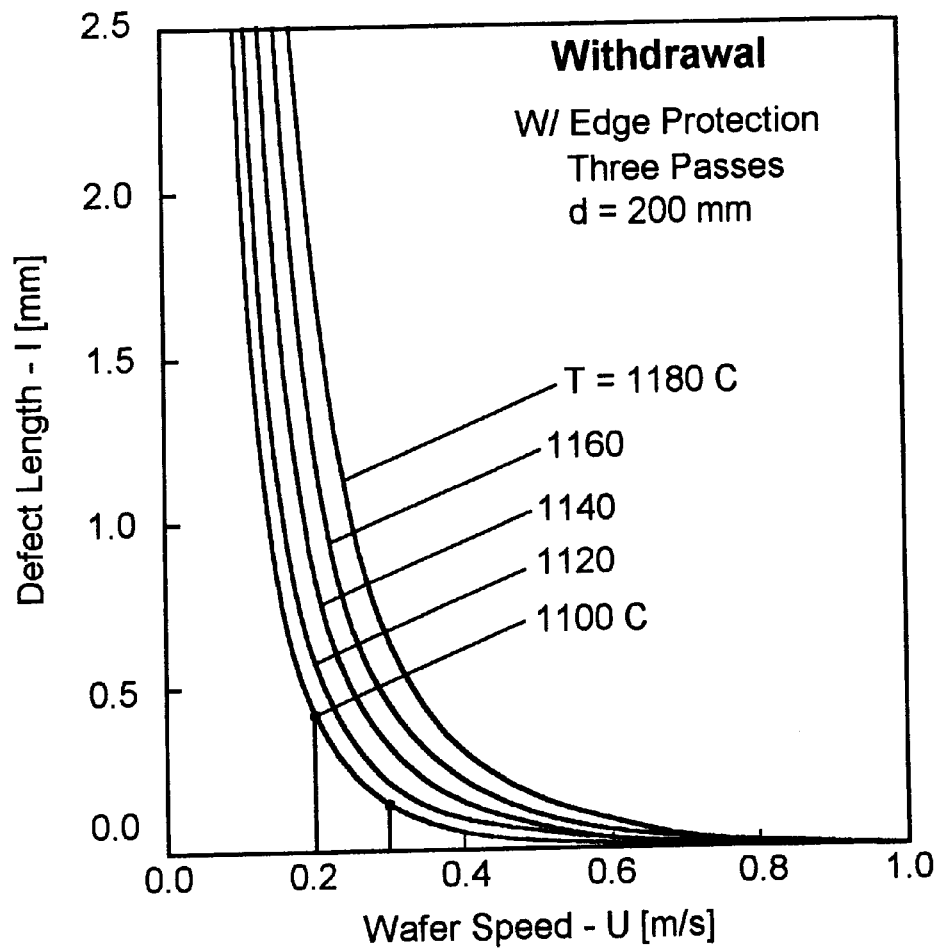
FIG. 14 illustrates computed defect lengths for a 200 mm silicon wafer undergoing three process cycles as a function of withdrawal speed for a range of cavity temperatures in an exemplary embodiment of the present invention.

Computed defect lengths for a 200 mm wafer undergoing three processing cycles are shown in FIG. 14 as a function of wafer withdrawal speed for a range of cavity temperatures. Defect lengths increase very strongly as the wafer speed is reduced below the value for defect-free processing. Increasing temperature likewise rapidly increases defect lengths since increasing temperature both reduces the yield stress and increases molecular energies relative to the activation energy for dislocation propagation. Table 6 below summarizes the speed of withdrawal, time of exposure to thermal differential, and defect length for wafers at 1100° C., 1140° C. and 1180° C.

TABLE 6

| | | Defect Length [mm] | | |
|---|---|---|---|---|
| Speed [m/s] | Time [s] | 1100° C. | 1140° C. | 1180° C. |
| 0.2 | 1.00 | 0.40 | 0.87 | 1.65 |
| 0.4 | 0.50 | 0.06 | 0.14 | 0.32 |
| 0.6 | 0.33 | 0.01 | 0.02 | 0.10 |
| 0.8 | 0.25 | 0 | 0.01 | 0.03 |
| 1.0 | 0.20 | 0 | 0 | 0.01 |

TABLE 6-continued

The symbols shown in FIG. 14 represent measured defect lengths for withdrawal speeds of 0.2 and 0.3 m/s and a wafer temperature of about 1100° C. in the second embodiment.

From the foregoing description, one skilled in the art can readily ascertain the essential characteristics of the present invention. The description is intended to be illustrative of the present invention and is not to be construed as a limitation or restriction thereon, the invention being delineated in the following claims.

We claim:

1. An apparatus for rapid thermal processing of semiconductor wafers, comprising:
   a) a furnace having a base, side walls, and a top, wherein the base, side walls and top of the furnace are provided with heating means and define a cavity maintained at a substantially constant and uniform temperature and adapted to receive a semiconductor wafer, the heating means configured to heat the cavity to a temperature of at least 900° C.;
   b) means for inserting and withdrawing the wafer into and from the cavity and directly into the ambient; and
   c) means for controlling the speeds of insertion and withdrawal configured to provide a speed of insertion and withdrawal of at least 0.2 m/sec.

2. The apparatus of claim 1 further including a plurality of thermocouples attached to the base, side walls and top of said furnace.

3. The apparatus of claim 1, wherein the base, side walls and top are selected from the group consisting of metals, ceramics, glasses, refractive compounds, and combinations thereof.

4. The apparatus of claim 1 wherein the means for inserting and withdrawing the wafer is selected from a group consisting of pneumatic drives, ball screw drives, belt-driver rodless actuators and linear servo and stepper motors.

5. The apparatus of claim 1 wherein the heating means comprise resistance heaters.

6. The apparatus of claim 5 further including means for controlling power supplied to the resistance heaters.

7. The apparatus of claim 1 further including means for exposing the semiconductor wafer to reactant gases useful for chemical vapor deposition processing.

8. The apparatus of claim 1 wherein said means for inserting and withdrawing includes a wafer carrier that provides full support around the wafer perimeter and a radiation shield.

9. A method of rapid thermal processing semiconductor wafers comprising the steps of:
   a) heating a cavity within a furnace having a base, side walls and top provided with heating means to a substantially constant processing temperature;
   b) maintaining the heated cavity in a substantially isothermal condition at the processing temperature;
   c) inserting a semiconductor wafer into the heated isothermal cavity at a speed of at least 0.2 m/s for an isothermal cavity temperature of at least 900° C.; and
   d) withdrawing the semiconductor wafer from the heated isothermal cavity and directly into the ambient, wherein the speed of withdrawal is at least 0.2 m/sec.

10. An apparatus for thermally processing a semiconductor substrate comprising:
  a process chamber forming a heated cavity within which the substrate is processed;
  a heater system for heating the cavity to a processing temperature of at least 800 degrees Celsius;
  a robot for withdrawing the substrate from the heated cavity after processing into a substantially cooler thermal environment;
  wherein the temperature of the semiconductor substrate at commencement of withdrawal is at least 700 degrees Celsius hotter than the substantially cooler thermal environment; and
  the speed at which the semiconductor substrate is withdrawn is greater than about 0.3 meters per second.

11. The apparatus of claim 10 wherein the semiconductor substrate has a diameter of at least about 200 mm.

12. The apparatus of claim 10 wherein the semiconductor substrate has a diameter of at least about 300 mm.

13. The apparatus of claim 10 wherein the semiconductor substrate has a diameter of at least about 400 mm.

14. The apparatus of claim 10 wherein the speed of withdrawal is sufficient to prevent plastic deformation of the semiconductor substrate due to the withdrawal into the substantially cooler thermal environment.

15. The apparatus of claim 10 wherein the heated cavity is enclosed within heat shielding walls and the heater system includes a heated surface disposed within the heated cavity, further comprising a support for moving the substrate substantially perpendicularly toward the heated surface for processing and away from the heated surface after processing.

16. The apparatus of claim 14 further comprising a support for the substrate wherein:
  the robot inserts the substrate into the heated cavity and places the substrate upon the support substantially parallel to the heated surface;
  the support moves the substrate substantially parallel and closely adjacent to the heated surface for processing and substantially parallel and away from the heated surface after processing; and
  the robot removes the substrate from the support and withdraws the substrate from the heated cavity.

17. The apparatus of claim 10 wherein the heater system maintains a substantially isothermal environment in the heated cavity for processing the semiconductor substrate.

18. The apparatus of claim 16 wherein the speed of withdrawal is sufficient to prevent plastic deformation of the semiconductor substrate due to the withdrawal into the substantially cooler thermal environment.

19. The apparatus of claim 10 wherein the speed of withdrawal is sufficient to substantially reduce plastic deformation of the substrate relative to the level of plastic deformation that would result at a speed of withdrawal of about 0.2 meters per second.

20. The apparatus of claim 10 wherein the speed of withdrawal is greater than about 0.5 meters per second.

21. The apparatus of claim 10 wherein the speed of withdrawal is greater than about 0.75 meters per second.

22. The apparatus of claim 10 wherein the speed of withdrawal is greater than about 1 meter per second.

23. The apparatus of claim 10 wherein the speed of withdrawal is greater than about 1.5 meters per second.

24. The apparatus of claim 10 wherein the speed of withdrawal is greater than about 2 meters per second and the substrate has a diameter of at least about 300 mm.

25. The apparatus of claim 10 wherein the speed of withdrawal is between about 0.4 to 1.2 meters per second.

26. The apparatus of claim 10 wherein the speed of withdrawal is between about 0.3 to 1.2 meters per second and is selected such that plastic deformation defects are formed which are limited to point-like defects with lengths less than about 100 microns.

27. The apparatus of claim 23 wherein the substrate has a diameter of at least 300 mm.

28. The apparatus of claim 10 wherein the substantially cooler thermal environment has a temperature of less than about 200 degrees Celsius.

29. The apparatus of claim 10 wherein the processing temperature is greater than about 1000 degrees Celsius and the semiconductor substrate has a diameter of at least 150 mm.

30. The apparatus of claim 10 wherein the processing temperature is greater than about 1100 degrees Celsius and the semiconductor substrate has a diameter of at least 150 mm.

31. The apparatus of claim 10 further comprising a heat shield for the edge of the semiconductor substrate which decreases the rate of cooling at the edge of the substrate after withdrawal.

32. The apparatus of claim 10 further comprising a substrate carrier having an areal thermal mass substantially equal to the substrate and having a thickness within a factor of four of the substrate thickness, wherein the substrate carrier extends beyond the edge of the substrate by a distance equal to at least one half of the height of the heated cavity.

33. The apparatus of claim 10 further comprising a substrate carrier supporting the substrate around the periphery of the substrate, wherein the substrate carrier is moved substantially along the plane of the substrate to accelerate the substrate for insertion and withdrawal by applying a force to the edge of the substrate through the substrate carrier.

34. The apparatus of claim 10 further comprising a robot for inserting the substrate into the heated cavity for processing at a speed of insertion of at least 0.3 m/sec.

35. The apparatus of claim 34, wherein the speed of withdrawal is greater than the speed of insertion.

36. A method for thermally processing a semiconductor substrate comprising:
  heating the semiconductor substrate in a heated cavity to a processing temperature of at least 800 degrees Celsius; and
  withdrawing the semiconductor substrate from the heated cavity after processing into a substantially cooler thermal environment wherein:
    the temperature of the semiconductor substrate at commencement of withdrawal is at least 700 degrees Celsius hotter than the substantially cooler thermal environment; and
    the speed at which the semiconductor substrate is withdrawn is greater than about 0.3 meters per second.

37. The method of claim 36 wherein the semiconductor substrate has a diameter of at least 300 mm.

38. The method of claim 36 wherein the speed of withdrawal is sufficient to prevent plastic deformation of the semiconductor substrate due to the withdrawal into the substantially cooler thermal environment.

39. The method of claim 36 wherein the substrate is inserted into and removed from the heated cavity laterally.

40. The method of claim 36 further comprising the step of maintaining the heated cavity at a substantially uniform and constant temperature for processing the semiconductor substrate.

41. The method of claim 40 wherein the speed of withdrawal is sufficient to prevent plastic deformation of the semiconductor substrate due to the withdrawal into the substantially cooler thermal environment.

42. The method of claim 36 wherein the speed of withdrawal is sufficient to substantially reduce plastic deformation of the substrate relative to the level of plastic deformation that would result at a speed of withdrawal of about 0.2 meters per second.

43. The method of claim 36 wherein the speed of withdrawal is greater than about 0.5 meters per second.

44. The method of claim 36 wherein the speed of withdrawal is greater than about 0.75 meters per second.

45. The method of claim 36 wherein the speed of withdrawal is greater than about 1 meter per second.

46. The method of claim 36 wherein the speed of withdrawal is greater than about 1.5 meters per second.

47. The method of claim 36 wherein the speed of withdrawal is greater than about 2 meters per second and the substrate has a diameter of at least about 300 mm.

48. The method of claim 36 wherein the speed of withdrawal is between about 0.3 to 1.2 meters per second and is selected such that plastic deformation defects are formed which are limited to point-like defects with lengths less than about 100 microns.

49. The method of claim 36 wherein the processing temperature is greater than about 1000 degrees Celsius.

50. The method of claim 36 wherein the processing temperature is greater than about 1100 degrees Celsius and the substrate has a diameter of at least about 150 mm.

51. A method for thermally processing a semiconductor substrate comprising:
heating the semiconductor substrate in a first thermal environment to a processing temperature of at least 900 degrees Celsius;
providing a second thermal environment to which the substrate is withdrawn after processing, wherein a temperature differential exists between the first thermal environment and the second thermal environment of at least 500 degrees Celsius;
moving the substrate from the first thermal environment to the second thermal environment such that first and second portions of the substrate are exposed to the first and second thermal environments, respectively, for a period of time, wherein the substrate is moved at sufficient speed such that the period of time is less than about 0.75 seconds.

52. The method of claim 51 wherein the differential is at least 900 degrees Celsius.

53. The method of claim 51 wherein the substrate has a diameter of at least 300 mm.

54. The method of claim 52 wherein the period of time is less than about 0.5 seconds.

55. The method of claim 51 wherein the processing temperature is at least 1100 degrees Celsius, the differential is at least 1000 degrees Celsius, and the period of time is less than about 0.4 seconds.

56. The method of claim 51 wherein the first thermal environment is substantially isothermal.

57. The method of claim 55 wherein the first thermal environment is substantially isothermal.

58. The method of claim 51 wherein the speed of withdrawal is sufficient to substantially reduce plastic deformation relative to that which would result if the substrate were exposed to the differential for between about 1 to 2 seconds.

59. The method of claim 51 wherein the speed of withdrawal is sufficient to substantially prevent plastic deformation of the semiconductor substrate.

60. A method for thermally processing a semiconductor substrate in a heated cavity, wherein removal of the substrate from the heated cavity during multiple cycles at speeds of about 0.2 meters per second would result in significant plastic deformation for a desired processing temperature, the method comprising:
heating the semiconductor substrate to the desired processing temperature in the heated cavity; and
removing the substrate from the heated cavity after processing at a speed greater than about 0.3 meters per second wherein the speed is sufficient to substantially reduce the level of plastic deformation after multiple cycles relative to the level of plastic deformation that would occur if removal speeds of about 0.2 meters per second had been used.

61. The method of claim 60 further comprising the step of maintaining the heated cavity at a substantially constant and uniform temperature.

62. The method of claim 60 wherein the speed of removal is sufficient to substantially prevent plastic deformation.

63. The method of claim 60 wherein the processing temperature is greater than about 1000 degrees Celsius and the speed of removal is greater than about 0.5 meters per second.

64. The method of claim 60 wherein the processing temperature is greater than about 1000 degrees Celsius and the speed of removal is greater than about 0.75 meters per second.

65. The method of claim 60 wherein the processing temperature is greater than about 1100 degrees Celsius and the speed of removal is greater than about 1 meter per second and the substrate has a diameter of about 300 mm.

66. The method of claim 64 wherein the substrate has a diameter of at least 300 mm.

67. The method of claim 60 wherein the speed of removal is selected such that plastic deformation defects are formed which are limited to point-like defects with lengths less than about 100 microns.

68. The method of claim 67 wherein the speed of removal is between about 0.3 and 1 meters per second.

69. The method of claim 60 wherein defects of greater than 1 mm in length would be formed after multiple cycles at a removal speed of 0.2 meters per second and wherein the speed of removal is selected such that defects of greater than 1 mm in length are substantially avoided.

* * * * *